United States Patent [19]

Ghoshal et al.

[11] Patent Number: 5,388,068
[45] Date of Patent: Feb. 7, 1995

[54] SUPERCONDUCTOR-SEMICONDUCTOR HYBRID MEMORY CIRCUITS WITH SUPERCONDUCTING THREE-TERMINAL SWITCHING DEVICES

[75] Inventors: Uttam S. Ghoshal; Harry Kroger, both of Austin, Tex.

[73] Assignee: Microelectronics & Computer Technology Corp., Austin, Tex.

[21] Appl. No.: 136,728

[22] Filed: Oct. 14, 1993

Related U.S. Application Data

[63] Continuation of Ser. No. 717,305, Jun. 17, 1991, abandoned, which is a continuation-in-part of Ser. No. 518,004, May 2, 1990, Pat. No. 5,024,993.

[51] Int. Cl.[6] .................... G11C 11/44; G11C 11/34; G11C 11/00; G11C 19/08
[52] U.S. Cl. .................... 365/162; 365/161; 365/177; 365/182; 369/145; 505/170; 505/193; 505/834; 505/837; 505/841
[58] Field of Search .............. 365/160, 161, 162, 177, 365/182; 369/145; 505/834, 837, 841, 170, 193; 257/36–39

[56] References Cited

U.S. PATENT DOCUMENTS

| | | | |
|---|---|---|---|
| 3,387,286 | 6/1968 | Dennard . | |
| 3,744,038 | 7/1973 | Kneupel et al. | 340/173.1 |
| 3,914,702 | 10/1975 | Gehweiler | 307/451 |
| 3,953,749 | 4/1976 | Baechtold et al. | 307/462 |
| 4,130,893 | 12/1978 | Henkels | 365/162 |
| 4,360,898 | 11/1982 | Faris | 365/162 |
| 4,398,267 | 8/1983 | Furuyama | 365/182 |
| 4,414,480 | 11/1983 | Zaslo | 307/443 |
| 4,430,582 | 2/1984 | Bose et al. | 307/475 |
| 4,437,227 | 3/1984 | Flannery et al. | 29/589 |
| 4,458,495 | 7/1984 | Gheewala | 307/541 |
| 4,499,119 | 2/1985 | Smith | 427/63 |
| 4,509,146 | 4/1985 | Wang et al. | 365/162 |
| 4,518,868 | 5/1985 | Harada et al. | 307/476 |
| 4,609,836 | 9/1986 | Koike | 307/451 |
| 4,633,439 | 12/1986 | Harada et al. | 365/162 |
| 4,638,185 | 1/1987 | Kobayashi et al. | 307/306 |
| 4,638,187 | 1/1987 | Boler et al. | 307/451 |

(List continued on next page.)

FOREIGN PATENT DOCUMENTS

| | | | |
|---|---|---|---|
| 0051797 | 4/1979 | Japan | 307/541 |
| 58-51527 | 3/1983 | Japan . | |
| 58-139198 | 9/1984 | Japan . | |
| 63-1085 | 6/1986 | Japan . | |
| 61-165888 | 7/1986 | Japan . | |
| 0012212 | 1/1987 | Japan | 307/462 |
| 62-131588 | 6/1987 | Japan . | |
| 63-87697 | 4/1988 | Japan . | |
| 64-45179 | 2/1989 | Japan . | |
| 02-100382 | 4/1990 | Japan . | |

OTHER PUBLICATIONS

Faris, "Superconducting Sequential Sampler," IBM T.D.B., vol. 26, No. 4, Sep. 1983, pp. 2186–2187.

(List continued on next page.)

*Primary Examiner*—Rolf Hille
*Assistant Examiner*—Mahshid Saadat
*Attorney, Agent, or Firm*—Fulbright & Jaworski

[57] ABSTRACT

Superconducting-semiconducting hybrid memories are disclosed. These superconducting-semiconducting hybrid memories utilize semiconductor circuits to store information, and either superconducting or semiconducting or combinations of superconducting and semiconducting circuits, with at least some superconducting circuitry used, to write and read information. The state of memory cells in the hybrid memories is determined by utilizing superconductor current sensing schemes to detect currents in the bit-line, thereby avoiding any bit-line charging delays and other problems associated with purely semiconductor memories. Additional features of the superconducting-semiconducting hybrid memories include wide margins, dense packing of memory cells, low power dissipation and fast access times. Interface curcuitry for converting superconducting signals to signals compatible with semiconductor circuits and for converting semiconductor signals to signals compatible with superconducting circuits is also disclosed.

32 Claims, 11 Drawing Sheets

U.S. PATENT DOCUMENTS

| | | | |
|---|---|---|---|
| 4,663,620 | 5/1987 | Paul et al. | 340/825.5 |
| 4,706,240 | 11/1987 | Payne, III | 370/60 |
| 4,710,649 | 12/1987 | Lewis | 307/451 |
| 4,719,369 | 1/1988 | Asano et al. | 307/443 |
| 4,727,266 | 2/1988 | Fujii et al. | 307/443 |
| 4,760,292 | 7/1988 | Bach | 307/475 |
| 4,779,230 | 10/1988 | McLaughlin et al. | 365/177 |
| 4,780,750 | 10/1988 | Nolan et al. | 357/23.5 |
| 4,785,426 | 11/1988 | Harada | 365/162 |
| 4,791,321 | 12/1988 | Tanaka et al. | 307/451 |
| 4,807,183 | 2/1989 | Kung et al. | 364/900 |
| 4,817,082 | 3/1989 | Oric | 370/58 |
| 4,837,536 | 6/1989 | Honjo | 307/306 |
| 4,845,539 | 7/1989 | Inoue | 357/23.6 |
| 4,845,722 | 7/1989 | Kent et al. | 370/58 |
| 4,849,751 | 7/1989 | Barber et al. | 340/825.02 |
| 4,852,083 | 7/1989 | Niehaus et al. | 370/58 |
| 4,859,897 | 8/1989 | Przybysz | 307/476 |
| 4,888,629 | 12/1989 | Harada et al. | 357/5 |
| 4,891,682 | 1/1990 | Yusa et al. | 357/30 |
| 4,920,512 | 4/1990 | Miyamoto | 365/160 |
| 4,974,205 | 11/1990 | Kotani | 365/162 |
| 4,980,580 | 12/1990 | Ghoshal | 307/451 |
| 4,994,434 | 2/1991 | Hung et al. | 501/1 |
| 5,024,993 | 6/1991 | Kroger et al. | 505/1 |
| 5,030,617 | 7/1991 | Legge | 505/1 |
| 5,051,627 | 9/1991 | Schneier et al. | 365/162 |
| 5,057,491 | 10/1991 | Housley | 505/1 |
| 5,071,832 | 12/1991 | Iwamatsu | 505/1 |
| 5,107,461 | 4/1992 | Riva | 365/182 |
| 5,166,562 | 11/1992 | Allen et al. | 365/182 |
| 5,253,199 | 10/1993 | Gibson | 365/162 |

OTHER PUBLICATIONS

Ghoshal, et al., "Skin Effects in Narrow Copper Microstrip at 77 K," IEEE Trans. Microwave Theory Tech., vol. MTT-36, No. 12, Dec. 1988, pp. 1788–1795.

C. Hilbert, D. Gibson and D. Herrell, "A Comparison of lossy and superconducting interconnect for computers," submitted for publication in the IEEE Trans. Electron Devices.

Knight, et al., "A Self–Terminating Low–Voltage Swing CMOS Output Driver," IEEE Journal of Solid–State Circuits, vol. 23, No. 2, Apr. 1987, pp. 457–464.

Kwon, et al., "Superconductors as Very High-Speed System-Level Interconnects," IEEE Electron Letters, vol. EDL-8, No. 12, Dec. 1987, pp. 582–585.

Raver, "Open–Loop Limitations for Push–Pull Off–Chip Drivers," IEEE Journal of Solid–State Circuits, vol. SC-22, No. 2, Apr. 1987, pp. 145–150.

G. Sai–Halasz, et al., "Design and experimental technology for 0.1 um gate–length low–temperature operation FETs," IEEE Electron Device Lett., vol. EDL-8, No. 10, pp. 463–466, Oct. 1987.

"Hybrid Static Memory Cell," IBM Technical Disclosure Bulletin, vol. 31, No. 3 (Aug. 1988), pp. 204–205.

M. Abe and T. Mimura, "Ultrahigh–Speed HEMT LSI Technology for Supercomputer," IEEE *Journal of Solid–State Circuits*, vol. 26, pp. 1337–1344, Oct. 1991.

M. Aoki, S. Hanamura, T. Masuhara and K. Yano, "Performance and Hot Carrier Effects of Small Cryo–CMOS Devices," IEEE *Transactions on Electron Devices*, vol. 34, pp. 8–18, Jan. 1987.

E. Brown, M. A. Hollis, F. W. Smith, K—C Wang, P. Asbeck, "Resonant–Tunneling Diode Loads: Speed Limits and Applications in Fast Logic Circuits," 1992 ISSCC *Digest of Technical Papers*, vol. 35, pp. 142–143.

M. J. Burns, P. R. de la Houssaye, W. S. Ruby, S. D. Russell, L. P. Lee, G. A. Garcia and S. R. Clayton, "Demonstration of $Y_1Ba_2Cu_3O_{7-\delta}$ and CMOS Device Fabrication on the Same Sapphire Substrate," submitted to Applied Physics Letters Apr. 26, 1993.

T. D. Clark, R. J. Prance, and A. D. C. Grassie, "Feasibility of hybrid Josephson field effect transistors," *J. Appl. Phys.*, vol. 51, pp. 2736–2745, 1980.

J. D. Cressler, J. H. Comfort, E. F. Crabbe, G. L. Patton, W. Lee, J. Y. C. Sun, J. M. C. Stork, and B. S. Meyerson, "Sub–30–ps ECL Circuit Operation at Liquid–Nitrogen Temperature Using Self–Aligned Epitaxial SiGe–Base Bipolar Transistors," IEEE *Elect. Device Let.*, vol. 12, pp. 166–168, 1991.

L. Deferm, E. Simoen and C. Claeys, "The Importance of the Internal Bulk–Source Potential on the Low Temperature Kink in NMOSTs," IEEE *Transactions on Electron Devices*, vol. 38, pp. 1459–1466, Jun. 1991.

T. Elewa, F. Balastra, S. Cristoloveanu, I. Hafez, J–P. Colinge, A–J. Auberton–Herve and J. Davis, "Performance and Physical Mechanisms in SIMOX MOS Transistors Operated at Very–Low Temperatures," IEEE *Transactions on Electron Devices*, vol. 37, pp. 1007–1019, Apr. 1990.

R. Fink, et al., "Hysteretic Josephson Junctions from $YBa_2Ca_3O_{7-x}/SrTiO_3/BA_{1-x}K_xBiO_3$ . Trilayer Films," *Applied Physics Letters*, vol. 61, No. 5, Aug. 1992, pp. 595–597.

(List continued on next page.)

OTHER PUBLICATIONS

S. T. Flannagan, et al., "8 ns CMOS 64 K ×4 and 256 K×1 SRAMs," IEEE *Journal of Solid-State Circuits*, vol. 25, No. 5, Oct. 1990, pp. 1049–1056.

U. Ghoshal, T. Van Duzer and H. Kroger, "SPICE Models and Applications of Superconducting FETs and Higher-Voltage Josephson Gates," IEDM *Technical Digest*, pp. 349–352 (1991).

Z. Ivanov and T. Claeson and T. Anderson, "Three terminal Josephson junction with a semiconductor accumulation layer," in *Proc. 18th Int. Conf. on Low Temperature Physics (Kyoto); Jpn. J. Appl. Phys.*, vol. 26, pp. 1617–1618.

S. S. Iyer, G. L. Patton, J. Stork, B. Meyerson and D. Harame, "HBTs using Si-Ge Alloys," IEEE *Transactions on Electron Devices*, vol. 36, pp. 2043–2064, Oct. 1989.

Jia, et al., "Role of buffer layers for superconducting $YBa_2Cu_3O_{7-x}$ thin films on GaAs substrates," *Applied Physics Letters*, vol. 59(9), pp. 1120–1122 (Aug. 26, 1991).

R. Kiehl, J. Yates, L. Palmateer, S. Wright, D. Frank, T. Jackson, J. Degelormo, and A. Fleischman, "High Speed, Low Voltage Complementary Heterostructure FET Circuit Technology," *Gallium Arsenide IC Symposium Technical Digest*, pp. 101–104, Oct. 1991.

A. W. Kleinsasser and T. N. Jackson, "Prospects for Proximity Effect Superconducting FETs," IEEE *Transactions on Magnets*, vol. 25, No. 2, pp. 1274–1277 (1989).

U. Ghoshal, T. Van Duzer, D. Gibson and H. Kroger, "Josephson-CMOS Interface Circuits," IEEE 1992 Custom Integrated Circuits Conference, pp. 23.2.1–23.2.4, May 6, 1992.

K. Goossen, J. Cunningham, T. Y. Kuo, W. Jan and C. Fonstad, "Monolayer-δ-doped HBT Characteristics from 10 to 350 K," *Appl. Phys. Lett.*, vol. 59, pp. 682–684, Aug. 5, 1991.

Y. Hayashi, "Evaluation of CUBIC Devices," *Proceedings of the 9th Symposium on Future Electron Devices*, pp. 267–272, Nov. 1990.

K. Ikossi-Anastasiou, A. Ezis, K. R. Evans, and C. E. Stutz, "Low-Temperature Characterization of High-Current-Gain Graded-Emitter AlGaAs/GaAs Narrow-Base Heterojunction Bipolar Transistor," IEEE *Electron Device Let.*, vol. 13, pp. 414–416, 1992.

Z. Ivanov and T. Claeson, "A three terminal Josephson junction with a semiconducting two-dimensional electron gas layer," IEEE *Trans. Magn.*, vol. MAG-23, 711–713, 1987.

J. S. Martens, D. S. Ginley, J. B. Beyer, J. E. Nordman, and G. K. G. Hohenwarter, *A Model and Equivalent Circuit for a Superconducting Flux Flow Transistor*, IEEE Trans. on Appl. Supercond., vol. 1, pp. 95–102 (1991).

J. S. Martens, V. M. Hietala, T. E. Zipperian, S. R. Kurtz, D. S. Ginley, C. P. Tigges, J. M. Phillips, and N. Newman, *High Temperature Superconducting Transimpedance Amplifiers for Far-infrared Detectors*, IEEE Trans. on Appl. Supercond., vol. 2, pp. 111–113, 1992.

J. Martens, V. Hietala, T. Zipperian, G. Vawter, D. Ginley, C. Tigges and T. Plut, "Fabrication of TlCaBaCuO Step-Edge Josephson Junctions with Hysteric Behavior," preprint submitted to Applied Physics Letters, Feb. 15, 1992.

M. F. Millea, A. H. Silver, and L. D. Flesner, *Superconductivity contact to p-In-As*, IEEE. Trans. Magn., vol. MAG-15, pp. 435–438, 1979.

S. Nagasawa, et al., 570-ps 13m W Josephson 1-K bit NDRO RAM, IEEE Journal of Solid-State Circuits, vol. 24, No. 5, pp. 1363–1371, Oct. 1989.

Tarutani, et al., "Superconducting Characteristics of a Planar-type $HoBa_2Cu_3O_{7-x}$-$La_{1.5}Ba_{1.5}Cu_3O_{7-4}$-$HoBa_2Cu_3O_{7-x}$ Junction," Appl. Phys. Lett. 58, pp. 2707–2709 (Jun. 1991).

T. van Duzer, *Superconductor-Semiconductor Hybrid Devices, Circuits and Systems*, Cryogenics, vol. 28, pp. 527–531 (1988).

G. F. Virshup, M. Klausmeier-Brown, I. Bozovic and J. Eckstein, "Hysteretic High-Tc Josephson Junctions Using Heterostructure Tri-Layer Films Grown by MBE," preprint from Varian Research Center.

Yuh, A *buffered Nondestructive-Readout Josephson Memory Cell with Three Gates*, IEEE, Trans. Magnetics, vol. 27, No. 2, pp. 2876–2878, Mar. 1991.

U.S. patent application Ser. No. 07/638,911, filed Jan. 1, 1991, by Harry Kroger and Uttam Ghoshal, entitled "Hybrid Superconductor-Semiconductor Crossbar Circuit."

U.S. patent application Serial No. 7/518,005, filed May 2, 1990, by Harry Kroger, entitled "Superconducting-Semiconducting Cross-Bar Applications."

(List continued on next page.)

OTHER PUBLICATIONS

Nishino, et al., *Three-Terminal Superconducting Device Using a Si Single-Crystal Film*, IEEE Electron Device Letters, vol. EDL-6, No. 6, pp. 297–299, Jun. 1985.

T. Nichino and U. Kawabe, *Realization of semiconductor-coupled superconducting transistor*, in Proc. 2nd Int. Symp. Foundations of Quantum Mechanics (Tokyo), pp. 231–240, 1986.

C. E. Shannon, *A Symbolic Analysis of Relay and Switching Circuits*, AIEE Transactions, vol. 57, pp. 713–723 (1938).

Silver, et al., *As-deposited superconducting V–Ba–Cu–O thin films on $Si,Al_2O_3$, and $SrTiO_3$ substrates*, Applied Physics Letters, vol. 52, (25), pp. 2174–2175 (Jun. 20, 1988).

A. H. Silver, A. B. Chase, M. McCall, and M. F. Millea, *Superconductor–semiconductor device research*, in Future Trends in Superconductive Electronics, B. S. Dever, C. M. Falco, J. H. Harris, and S. A. Wolf, Eds., New York, N.Y.: Am. Inst. of Physics, 1978, pp. 368–379.

E. Simoen, B. Dierickx, L. Warmerdam, J. Vermeiren and C. Claeys, "Freeze-out Effects on NMOS Transistor Characteristics at 4 K," IEEE *Transactions on Electron Devices*, vol. 36, pp. 1155–1161, Jun. 1989.

H. Suzuki, T. Imamura, and S. Hasuo, *Josephson Semiconductor Interface Circuit*, Cryogenics, vol. 30, pp. 1005–1008, 1990.

H. Takayangi and T. Kawakami, *Superconducting proximity effect in the native inversion layer on InAs*, Phys. Rev. Lett., vol. 55, pp. 2449–2452, Jun. 3, 1985.

A. W. Kleinsasser and T. N. Jackson, *Superconductivity and field effect transistors*, in Proc. 18th Int. Conf. on Low Temperature Physics (Kyoto); Jpn. J. Appl. Phys., vol. 26, pp. 1545–1546, 1987.

A. W. Kleinsasser, et al., *Semiconductor heterostructure weak links for superconducting FET applications*, IEEE Trans. Magn., vol. MAG-23, pp. 703–706, 1987.

H. Kroger and U. Ghoshal, *Can Superconductive Digital Systems Compete with Semiconductor Systems?*, IEEE Trans. on Appl. Superconductivity, vol. 3, No. 1, pp. 2307–2314, Mar. 1993.

H. Kroger, et al., *Superconductor–Semiconductor Hybrid Devices, Circuits and Systems*, proceedings of the IEEE, vol. 77, No. 8, Aug. 1989.

H. Kroger, *Josephson Devices Coupled by Semiconductor Links*, IEEE Trans. Electron Devices, vol. ED-27, pp. 2016–2126 (1980).

K. Lehovec, "GaAs Enhancement-Mode FET Tunnel Diode Ultra-Fast Low-Power Inverter and Memory Cell," *IEEE J. Solid-State Circuits*, vol. 14, pp. 797–800, 1979.

R. Marcus, X. Wu, A. Inam, and T. Venkatesan, "Electrostatic Bonding of High-Tc Superconducting Films to Any Substrate," *Journal of Superconductivity*, vol. 1, No. 3, pp. 295–302, 1988.

Deen, "Low Temperature Microelectronics: Opportunities and Challenges," *Extend Abstracts of the Symposium on Low Temperature Device Operation*, vol. V91-1 (May 1991) (Abstract No. 263), pp. 384–385.

Gildenblat, G. Sh. and Huang, C.-L., "Device and Mobility Models for CRYOCMOS," *Extend Abstracts of the Symposium on Low Temperature Device Operation*, vol. V91-1 (May 1991) (Abstract No. 264), pp. 386–387.

Emrani, A., Ghibaudo, G. and Balestra, F., "Modeling at Low and Very Low Temperature in Silicon MOS Transistors," *Extend Abstracts of the Symposium on Low Temperature Device Operation*, vol. 91-1 (May 1991) (Abstract No. 265), pp. 388–389.

Weybright, M. E. and Plumber, J. D., "Bipolar Transistor Modeling Over Temperature," *Extend Abstracts of the Symposium on Low Temperature Device Operation*, vol. V91-1 (May 1991) (Abstract No. 266), pp. 390–391.

Richey, D. M., Beaty, R. E. and Jaeger, R. C., "Observations on Low Temperature NPN Bipolar Transistor Simulations Using Bilow," *Extend Abstracts of the Symposium on Low Temperature Device Operation*, vol. V91-1 (May 1991) (Abstract No. 267)., pp. 392–393.

Agrusti, C., Pignatel, G. U. and Tangorra, R., "Low-Temperature Modeling of Silicon JFETs," *Extend Abstracts of the Symposium on Low Temperature Device Operation*, vol. 91-1 (May 1991) (Abstract No. 268), pp. 393–394.

Leupp, D. G. and Oleszek, G. M., "Low Temperature Modeling of Germanium MOSFET's Using Pisces," *Extend Abstracts of the Symposium on Low Temperature Device Operation*, vol. V91-1 (May 1991) (Abstract No. 269), p. 395.

Yi, Y. W., Masu, K. Tsubouchi, K. and Mikoshiba, N., "Small-Size-Effect Suppressed Design for Low-Temperature Deep-Submicron MOSFET's with Low Supply Voltage," *Extend Abstracts of the Symposium on Low Temperature Device Operation*, vol. V91-1 (May 1991) (Abstract No. 270), pp. 396–397.

(List continued on next page.)

OTHER PUBLICATIONS

Simoen, E., Dierickx, B., Gao, M-H., and Claeys, C., "Transient behavior of Si MOS Transistors at liquid helium temperatures," *Extend Abstracts of the Symposium on Low Temperature Device Operation*, vol. V91-1 (May 1991) (Abstract No. 271), pp. 398-399.

K. Aoki, Y. Tazoh and H. Yoshikiyo, "Low Crosstalk Packaging Design for Josephson Logic Circuits," *IEEE Transactions on Magnetics*, vol. Mag-21, No. 2, Mar. 1985, pp. 741-744.

U. Ghoshal, H. Kroger, and T. Van Duzer, "Superconductor-Semiconductor Memories," *IEEE Transactions on Applied Superconductivity*, vol. 3, No. 1, Mar. 1983, pp. 2315-2318.

W. Henkels, D. Wen, R. Mohler, R. Franch, T. Bucelot, C. Long, J. Bracchita, W. Cote, G. Bronner and R. Dennard, "A 4-Mb Low-Temperature DRAM," *IEEE Journal of Solid-State Circuits*, vol. 26, No. 11, Nov. 1991, pp. 1519-1529.

W. Henkels, N. Lu, W. Hwang, T. Rajeevakumar, R. Franch, D. Heidel, M. Immediato, "A 12-ns Low--Temperature DRAM," *IEEE Transactions on Electron Devices*, vol. 36, No. 8, Aug. 1989, pp. 1414-1422.

T. Hsiang, S. Shapiro, "Integrated Superconducting Electronics," VLSI *Electronics: Microstructure Science*, vol. 7, Ch. 9, pp. 355-381 (1983).

H. Jones and D. Herrell, "The Characteristics of Chip-to-Chip Signal Propagation in a Package Suitable for Superconducting Circuits," *IBM J. Res. Develop.*, vol. 24, No. 2, Mar. 1980, pp. 172-177.

O. Kindl, W. Langheinrich, G. Fischer, "Cryo CMOS Technology", *Technical University of Darmstadt*, pp. 518, 23.

Kirschman, "Low-Temperature Semiconductor Electronics," *Extend Abstracts of the Symposium on Low Temperature Device Operation*, vol. V91-1 (May 1991) (Abstract No. 261), p. 382.

Foty, D., "Low Temperature Electronics and Future Electron Devices," *Extend Abstracts of the Symposium on Low Temperature Device Operation*, vol. V91-1 (May 1991) (Abstract No. 262), p. 383.

U.S. patent application Ser. No. 07/856,501, filed Mar. 24, 1992, by Curtis Potter, Dave Gibson and Uttam Ghoshal, entilted "Coaxial Die and Substrate Bumps."

U.S. patent application Ser. No. 08/059,476, filed May 7, 1993, by U. Ghoshal and D. Gibson, entitled "Continuous Superconductor to Semiconductor Convertor Circuit."

U.S. patent application Ser. No. 07/924,134, filed Aug. 3, 1992, by Harry Kroger, entitled "High Temperature Superconducting Semiconducting Hybrid Circuits Integrated Circuit Package."

U.S. patent application Ser. No. 08/170,548, filed Dec. 20, 1994, by Uttam Ghoshal, entitled "Ultra-Fast Superconductor-Semiconductor Amplifiers."

U.S. patent application Ser. No. 08/114,588, filed Aug. 31, 1993, by Uttam Ghoshal & Harry Kroger, entitled "Hybrid Superconducting-Semiconducting Memory and Memory Read-Out Circuits."

U.S. patent application Ser. No. 07/633,153, filed Dec. 20, 1990, by Harry Kroger, entitled "Process for Fabricating Superconducting Tunnel Junctions by Selectively Converting Upper Electrode Into an Insulator."

U.S. patent application Ser. No. 07/909,871, filed Jul. 7, 1992, by Uttam Ghoshal & Harry Kroger, entitled "Superconducting-Semiconducting Cross-Bar Circuit."

C. J. Anderson, M. Klein and M. B. Ketchen, "Transmission of High Speed Electrical Signals in a Josephson Package," *IEEE Transactions on Magnetics*, vol. Mag-19, No. 3 (May 1983), pp. 1182-1185.

Gutierrez, E. A. Deferm, C. L., and Declerck, G., "Temperature dependence of the electric field at the source side and its influence on the overall substrate current behavior of submicron NMOS transistors," *Extend Abstracts of the Symposium on Low Temperature Device Operation*, vol. V91-1 (May 1991) (Abstract No. 272), pp. 400-401.

Simone, E., Vanstaelen, G. and Claeys, C., "Low temperature behavior of MOS transistors fabricated on high-resistivity Si substrates," *Extend Abstracts of the Symposium on Low Temperature Device Operation*, vol. V91-1 (May 1991) (Abstract No. 273), pp. 402-403.

Henning, A. K., "Extraction of Barrier Heights in Si/-Si$_{1-x}$Ge$_x$ Heterojunctions with MIS Gates," *Extend Abstracts of the Symposium on Low Temperature Device Operation*, vol. V91-1 (May 1991) (Abstract No. 274), pp. 404-405.

Ng, A. Deen, M. J., Li, X. M. and Berolo, O., "Cryogenic D. C. and Low Frequency Noise Characteristics of AlAs/GaAs/AlAs Resonant Tunneling Diodes," *Extend Abstracts of the Symposium on Low Temperature Device Operation*, vol. V91-1 (May 1991) (Abstract No. 275), pp. 406-407.

(List continued on next page.)

OTHER PUBLICATIONS

Pires, R. G. Titcomb, S. L. and Anderson, R. L., "Effect of Carrier Saturation Velocity on the Determination of MOSFET Channel Length," *Extend Abstracts of the Symposium on Low Temperature Device Operation*, vol. V91-1 (May 1991) (Abstract No. 276), p. 408.

Laupp, D. G. and Oleszek, G., "Characterization of Germanium MOSFET's at 77 K," *Extend Abstracts of the Symposium on Low Temperature Device Operation*, vol. V91-1 (May 1991) (Abstract No. 277), p 409.

Henkels, W. H., "Low Temperature DRAM," *Extend Abstracts of the Symposium on Low Temperature Device Operation*, vol. V91-1 (May 1991) (Abstract No. 278), pp. 410–411.

Wyns, P., "Leakage Modeling in DRAMs and its Implications for the Design of Low Temperature Memory Cells," *Extend Abstracts of the Symposium on Low Temperature Device Operation*, vol. V91-1 (May 1991) (Abstract No. 279), pp. 412–413.

Blalock, T. N. and Jaeger, R. C., "Optimization of CMOS Low Temperature Quasi-Static RAM based on Non-Destructive Readout Cynamic Cell Structures," *Extend Abstracts of the Symposium on Low Temperature Device Operation*, vol. V91-1 (May 1991) (Abstract No. 280), p. 414.

Voldman, S. H. et al., "Low Temperature Analysis of Trench DRAM Storage Node and MOSFET Drain Leakage Mechanisms and Their Interactions," *Extend Abstracts of the Symposium on Low Temperature Device Operation*, vol. V91-1 (May 1991) (Abstract No. 281), p. 415.

Chen, Cherh-Lin and Jaeger, R. C., "Anomalous Retention Time Behavior in Cynamic Memory Cells at Low Temperature," *Extend Abstracts of the Symposium on Low Temperature Device Operation*, vol. V91-1 (May 1991) (Abstract No. 282), p. 417.

Dillard, W. C. and Jaeger, R. C., "Effects of Alpha Particle Radiation on Cynamic RAM's at Cryogenic Temperatures," *Extend Abstracts of the Symposium on Low Temperature Device Operation*, vol. V91-1 (May 1991) (Abstract No. 283), p. 418.

Tack, M. and Claeys, C., "Applications of the MCCM effect in SOI MOS transistors both at cryogenic and room temperatures," *Extend Abstracts of the Symposium on Low Temperature Device Operation*, vol. V91-1 (May 1991) (Abstract No. 284), pp. 419–420.

Cressler, J. D., "Is the Silicon Bipolar Transistor Useful for High–Speed Logic Applications at 77 K?Myths versus Reality," *Extend Abstracts of the Symposium on Low Temperature Device Operation*, vol. V91-1 (May 1991) (Abstract No. 285), pp. 421–422.

Chraznowska–Jeske, and Jaeger, R. C., "Influence of Charge Distribution on Unity Gain Frequency and Current Gain of Silicon Bipolar Transistor for Temperature Range 77° K–300° K.," *Extend Abstracts of the Symposium on Low Temperature Device Operation*, vol. V91-1 (May 1991) (Abstract No. 286), p. 423.

Cressler, J. D. et al., "The Performance Leverage of Epitaxial SiGe–Base Bipolar Transistors for 77 K Applications," *Extend Abstracts of the Symposium on Low Temperature Device Operation*, vol. V91-1 (May 1991) (Abstract No. 287), pp. 424–425.

Schwall, R. E., "Packaging Low Temperature Electronics for Commercial Applications," *Extend Abstracts of the Symposium on Low Temperature Device Operation*, vol. V91-1 (May 1991) (Abstract No. 288), p 426.

Ghoshal, T., Kroger, H. and VanDuzer, T., "Superconductive Interconnection Circuits for Cryogenic Semiconductor Systems," *Extend Abstracts of the Symposium on Low Temperature Device Operation*, vol. V91-1 (May 1991) (Abstract No. 289), pp. 427–428.

Hong, Ki Bum and Jaeger, R. C. "Power MOSFET Modeling and Applications at Liquid Nitrogen Temperature," *Extend Abstracts of the Symposium on Low Temperature Device Operation*, vol. V91-1 (May 1991) (Abstract No. 290), p. 429.

Jaeger, R. C. and Ramani, R., "Low Temperature Operation of Switches Capacitor Filters and D/A Converters," *Extend Abstracts of the Symposium on Low Temperature Device Operation*, vol. V91-1 (May 1991) (Abstract No. 291), p. 430.

Kroger, H., "Applications of Superconductivity to Packaging," *IEEE Circuits and Devices Magazines*, May 1989, pp. 16–21, 41.

H. Nambu, et al., "High–Speed Sensing Techniques for Ultrahigh–speed SRAM's," *IEEE Journal of Solid State Circuits*, vol. 27, No. 4, Apr. 1992, pp. 632–640.

S. Nagasawa, et al., "Subnanosecond Josephson High Speed Memory," *Microelectronics Research Laboratories*, NEC Corporation, pp. 401–406, publication and date unknown.

(List continued on next page.)

OTHER PUBLICATIONS

K. Sato, et al., "Inductance Measurement for Josephson Packaging Using a Resonance Method," *IEEE Transactions on Components, Hybrids and Manufacturing Technology*, vol. CHMT-9, No. 2, Jun. 1986, pp. 145–149.

D. H. Seib, "Cryogenic Electronics for Infrared Focal Plane Arrays," *Proceedings of the Symposium on Low Temperature Electronic and High Temperature Semiconductors*, vol. 88–89, pp. 499–517 (1988).

Shiota, T., et al., "An Observation of Quasi-Particle Tunneling Characteristics in all Y–Ba–Cu–O Thin Film Tunnel Junction," *Dept. of Electronics Engineering, Nagoya University*, pp. 1–4, date of publication unknown.

C. Y. Ting, et al., "Controlled Collapse Reflow for Josephson Chip Bonding," *IBM T. J. Watson Research Center*, pp. 210–212, (Abstract No. 80), date of publication unknown.

Wu, M., et al., "Superconductivity at 93 K in a New Mixed-Phase Y–Ba–Cu–O Compound System at Ambient Pressure," *Physical Review Letters*, vol. 58, No. 9, Mar. 2, 1987, pp. 908–910.

Wada, Y., et al., "WPM8.3: A 570ps, 13mW Josephson 1kb RAM," IEEE *International Solid-State Circuits Conference*, Feb. 17, 1988, pp. 84 and 311.

J. Wang et al., "Threshold Voltage Instability at Low Temperatures in Partially Depleted Thin-Film SOI MOSFET's," IEEE *Electron Devices Letters*, vol. 12, No. 6, Jun. 1991, pp. 300–302.

J. Yuan-Chen Sun, et al., "Submicrometer-Channel CMOS for Low-Temperature Operation," IEEE *Transactions on Electron Devices*, vol. Ed.-34, No. 1, Jan. 1987, pp. 19–27.

W. Carr, et al., "MOS/LSI Design and Application," p. 74, McGraw-Hill, 1972.

1991 *ISSCC Digest of Technical Papers*, pp. 30–31, Feb. 1991.

W. Anacker, "Computing at 4 degrees Kelvin," IEEE *Spectrum*, pp. 26–37, May 1979.

U. Ghoshal, "CMOS Inter-Chip Interconnection Circuit Using High-Tech Superconducting Tunnel Junctions and Interconnections," IEEE Electron Device Letters, vol. 10, pp. 373–376, Aug. 1989.

K. Itoh, "Trends in Megabit DRAM Circuit Design," IEEE I. Solid-State Circuits, vol. 25, pp. 778–789, Jun. 1990.

T. Chappell, S. Schuster, B. Chappell, J. Allan, J. Sun, S. Klepner, R. Franch, P. Greier and P. Restle, "A 3.5 ns/77 K and 6.2 ns/300 K 64 K CMOS RAM with ECL Interfaces," IEEE J. Solid-State Circuits, vol. 24, pp. 859–867, Aug. 1989.

R. Jaeger and T. Blalock, "Quasi-Static RAM Design for High Performance Operation at Liquid Nitrogen Temperature," Cryogenics, vol. 30, pp. 1030–1035, Dec. 1990.

H. Zappe, "Memory-Cell Design in Josephson Technology," IEEE Trans. Electron Devices, vol. ED-27, pp. 1870–1872, 1980.

Wada, "Josephson Memory Technology," Proc. IEEE, vol. 77, pp. 1194–1207, 1989.

A. Kleinsasser and W. Gallagher, "Three-terminal devices," in Superconducting Devices, Eds. S. Ruggiero and D. Rudman, San Diego: Academic Press, 1990, Chapter 9.

T. Nishino, M. Hatano, H. Hasegawa, F. Murai, T. Kure, A. Kiraiwa, K. Yagi and U. Kawabe, "0.1$\mu$gate length superconducting FET," IEEE Electron Device Letters, vol. 10, pp. 61–63, Feb. 1989.

T. Yamada, Y. Nakata, J. Hasegawa, N. Amano, A. Shibayama, M. Sasago, N. Matsuo, T. Yabu, S. Matsumoto, S. Okada, M. Inoue, "A 64 Mb DRAM with meshed power line and distributed sense amplifier driver," 1991 ISSCC Digest of Technical Papers, pp. 108–109, Feb. 1991.

S. Mori, H. Miyamoto, Y. Morooka, S. Kikuda, M. Suwa, M. Kinoshita, A. Hachisuka, H. Arima, M. Yamada, T. Yoshihara, S. Kayano, "A 45 ns 64 Mb DRAM with a merged match-line test architecture," 1991 ISSCC Digest of Technical Papers, pp. 110–111, Feb. 1991.

I. Kurosawa, H. Nakagawa, S. Kosaka, M. Aoyagi, S. Takada, "A 1-Kb Josephson RAM using variable threshold cells," IEEE J. Solid-State Circuits, vol. 24, pp. 1034–1039, Aug. 1989.

C. Mead and L. Conway, Introduction to VLSI System Reading, Mass.: Addison-Wesley Publishing Company, 1980, Chapters 8 and 9.

L. Glasser and D. Dobberpuhl, The Design and Analysis of VLSI Circuits, Reading, Mass.: Addison-Wesley Publishing Company, 1985, Chapter 7.

U. Ghoshal, H. Kroger, and T. Van Duzer, "Superconductive Interconnection Circuits for Cryogenic Semiconductor Systems", Proceedings of the Symposium on Low Temperature Device Operation, vol. 91-1, Electrochemical Society, 1991, pp. 427–428.

(List continued on next page.)

OTHER PUBLICATIONS

E. Seevenick, P. J. van Beers and H. Ontrop, "Current-Mode Techniques for High-Speed VLSI Circuits with Applications to Current Sense Amplifier for CMOS SRAMs," IEEE Journal of Solid-State Circuits, vol. 26, pp. 525–536, Apr. 1991.

S. Hanamura, M. Aoki, T. Masuhara, O. Minato, Y. Saki and T. Hayashida, "Low-Temperature CMOS 8×8 bit multipliers with sub-10 ns speeds," IEEE Trans. Electron Devices, vol. ED-34, pp. 94–100, Jan. 1987.

S. Hasuo and T. Imamura, "Digital Logic Circuits," Proc. IEEE, vol. 77, pp. 1177–1193, Aug. 1989.

Y. Tarutani, M. Hirano and U. Kawabe, "Niobium-based IC technologies," Proc. IEEE, vol. 77, pp. 1164–1176, Aug. 1989.

K. K. Likharev, V. K. Semenov and A. B. Zorin, "New possibilities for superconductor devices," in Superconducting Devices, Eds. S. Ruggiero and D. Rudman, San Diego: Academic Press, 1990, Chapter 1.

A. Frenkel, T. Venkatesan, C. Lin, X. Wu, M. Hegde, A. Inam and B. Dutta, "High-Tc superconducting film as a fast nonlinear switch for noise discrimination in digital circuits," Appl. Phys. Lett., vol. 53, pp. 2704–2706, Dec. 1988.

V. Newhouse, Applied Superconductivity, New York: John Wiley and Sons, 1964, Chapters 6 and 7.

J. S. Martens, D. S. Ginley, J. B. Beyer, J. Nordman and G. K. G. Hohenwarter, "A Josephenson Junction to FET High-Speed Line Driver Made of TICaBaCuO", IEEE Transactions on Magnetics, vol. 27, pp. 3284–3288, Mar. 1991.

A. Kadin, "Duality and fluxonics in superconducting devices," J. Appl. Phys., vol. 68, pp. 5741–5742, Dec. 1990.

H. Suzuki, A. Inoue, T. Imamura and S. Hasuo, "A Josephson Driver to Interface JJ to Semiconductor Transistors," 1988 IEDM Digest of Technical Papers, pp. 290–293, Dec. 1988.

A. Frenkel, T. Venkatesan, C. Lin, X. Wu and A. Inam, "Dynamic Electrical Response of $YBaCuO_2$" Journal of Applied Physics, vol. 67, pp. 3767–3775, Jan. 1990.

D. Jillie, L. Smith, H. Kroger, L. Currier, R. Payer, C. Potter and D. Shaw, "All-refractory Josephson logic circuits," IEEE J. Solid State Circuits, vol. SC-18, p. 173, 1983.

M. Delaney, R. Withers, A. Anderson, J. Green and R. Mountain, "Superconductive delay line with integral MOSFET taps," IEEE Trans. Magnetics, vol. MAG-23, pp. 791–795, Mar. 1987.

J. T. Pan, S. Poon and B. Nelson, "Copper/Polyimide Multichip Module," Proceedings of the Eighth Annual International Electronics Packaging Conference, pp. 174–189 (1988).

D. Fork, D. Fenner, A. Barrera, J. Phillips, T. Geballe, G. Connell and J. Boyce, "Buffer Layers for High-Quality Epitaxial YBCO Films on Si," IEEE Transactions on Applied Superconductivity, vol. 1, pp. 67–73, Mar. 1991.

T. S. Kalkur, R. Kwor and D. Byrne, "Effect on an $SiO_2$ layer on the superconductive properties of the high-Tc Bi-Sr-Ca-Cu-O films," Journal of Applied Physics, vol. 67, pp. 918–920, Jan. 1990.

A. Pargellis, F. Shariff, R. Dynes, B. Miller, E. Hellman, J. Rosamilia and R. Hartford, "All-High Tc Josephson Tunnel Junction: BaKBiO/BaKBiO junctions," Applied Physics Letters, vol. 58, pp. 95–96, Jan., 1991.

M. Aoki, T. Ishi, T. Yoshimura, Y. Kiyota, S. Iijima, T. Yamanaka, T. Kure, K. Ohyu, T. Nishida, S. Okasaki, K. Seki and K. Shimehigashi, "$0.1\mu$ CMOS devices using low impurity channel transistors," 1990 IEDM Digest of Technical Papers, pp. 939–941, Dec. 1990.

G. Shahidi, B. Davari, Y. Taur, J. Warnock, M. Wordeman, P. McFarland, S. Mader, M. Rodriguez, R. Assengza, G. Bronner, B. Ginsberg, T. Lii, M. Polcari and T. Ning, "Fabrication of CMOS on ultra-thin SOI obtained by epitaxial lateral overgrowth and chemical-mechanical polishing," 1990 IEDM Digest of Technical Papers, pp. 587–590, Dec. 1990.

P. K. Vasuder, "Ultrathin SOI for high speed submicrometer CMOS technology," Solid State Technology, pp. 61–65, Nov. 1990.

E. Vittoz and J. Fellrath, "CMOS Analog IC based on Weak inversion Operation," IEEE J. Solid-State Circuits, vol. SC-12, pp. 224–231, Jun. 1977.

D. Schmitt-Landsiedel, B. Hoppe, G. Neuendorf, M. Wurm and J. Winnerl, "Pipelined architecture for fast CMOS buffer RAMs," IEEE J. Solid-State Circuits, vol. 25, pp. 741–747, Jun. 1990.

D. Scott and N. C. Lu, "Technology Directions for Ultra-High Speed SRAMS," 1991 ISSCC Digest of Technical Papers, pp. 78–79, Feb. 1991.

M. Takada, K. Nakamura, T. Takeshima, K. Furata, T. Yamazaki, K. Imami, S. Ohi, Y. Fukuda, Y. Minato and K. Kimoto, "A 5 ns 1 Mb BiCMOS SRAM," 1991 ISSCC Digest of Technical Papers, pp. 138–139, Feb. 1990.

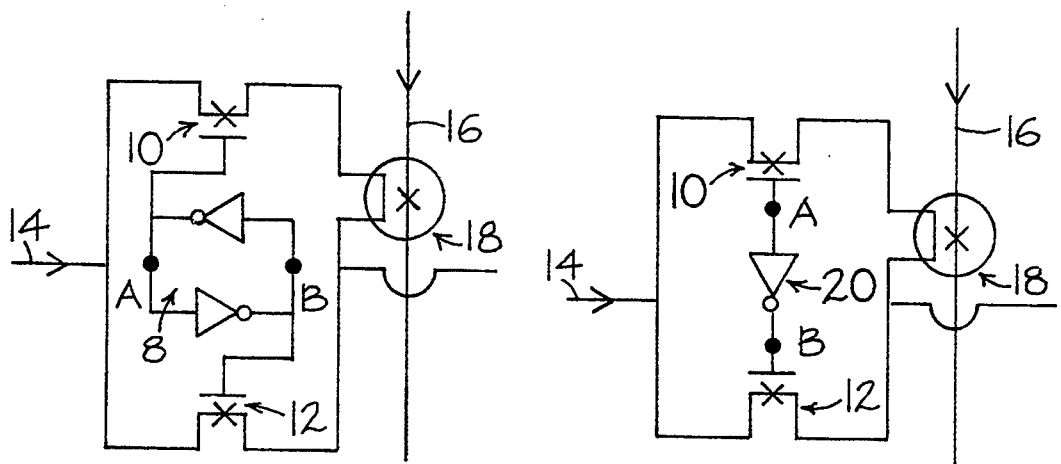
Fig. 1               Fig. 2a
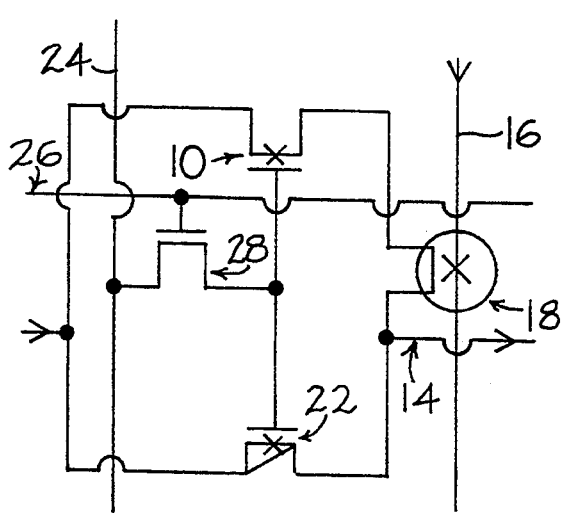      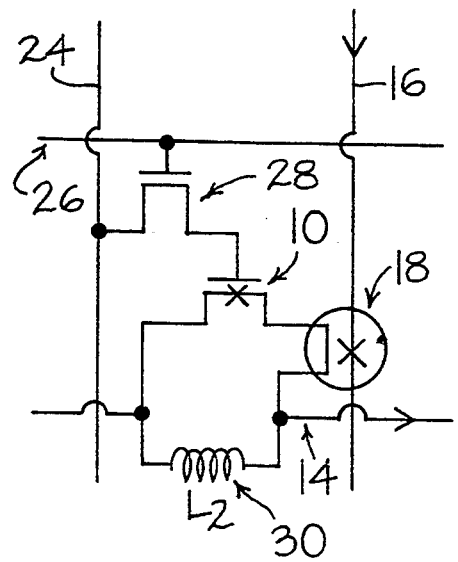
Fig. 2b              Fig. 2c

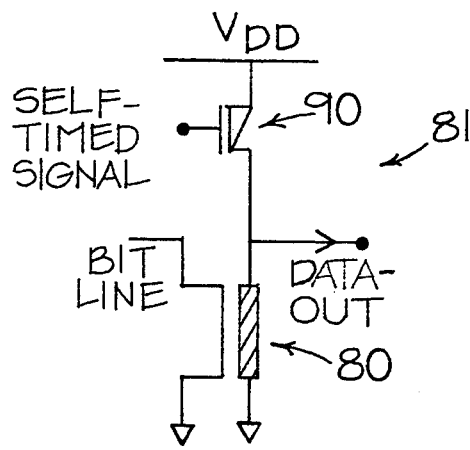
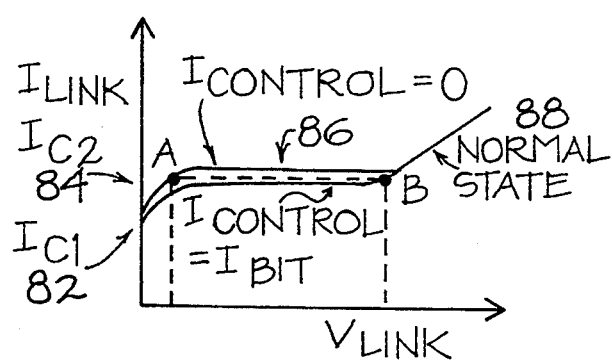
Fig. 7a
Fig. 7b
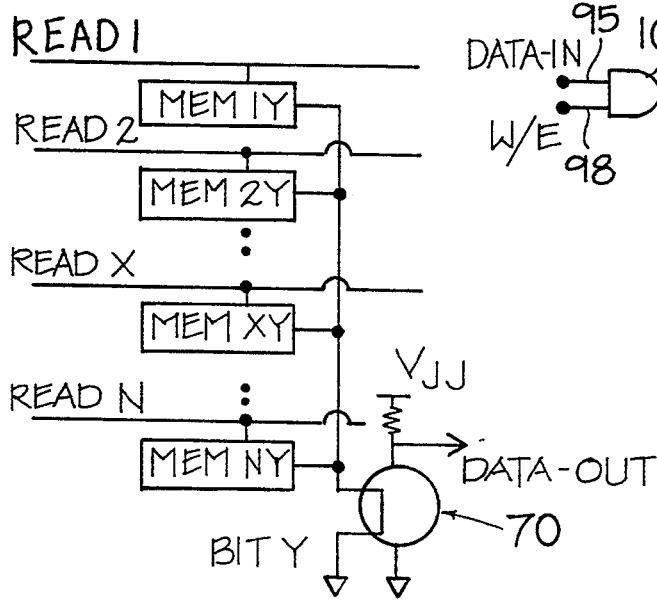
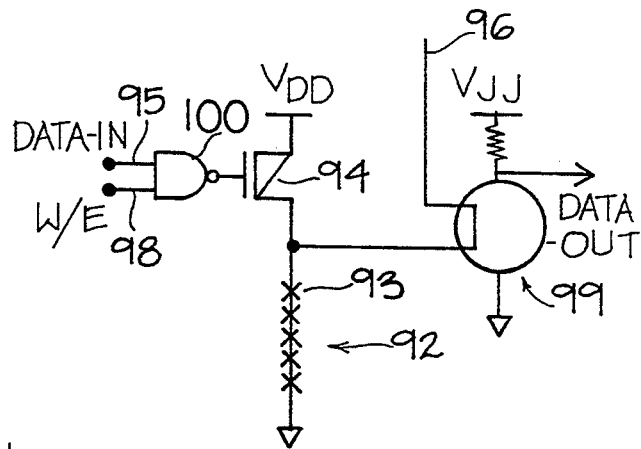
Fig. 8
Fig. 9a

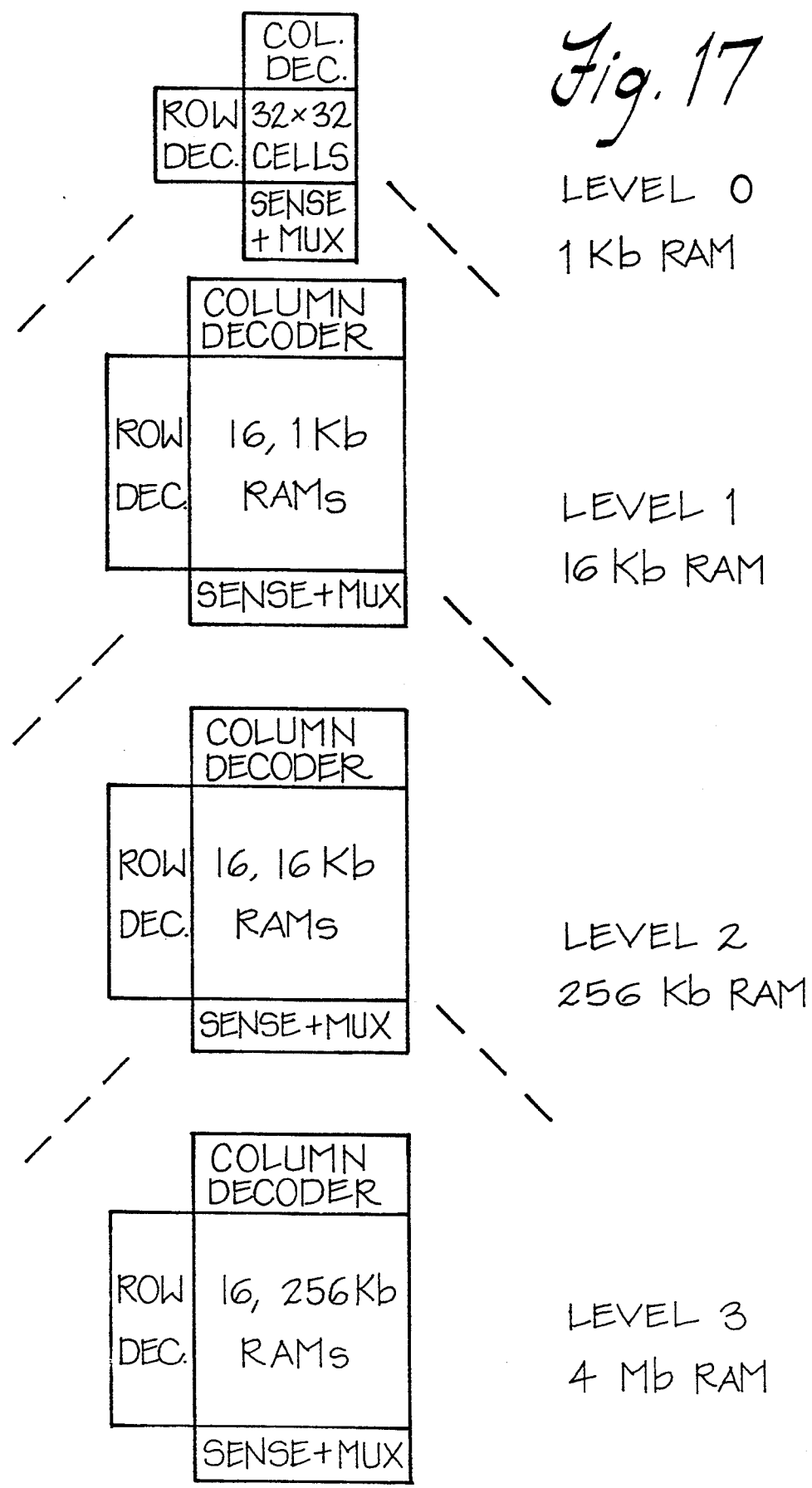

SUPERCONDUCTOR-SEMICONDUCTOR HYBRID MEMORY CIRCUITS WITH SUPERCONDUCTING THREE-TERMINAL SWITCHING DEVICES

U.S. GOVERNMENT LICENSE RIGHTS

The U.S. Government has a paid-up license in this invention in the right in limited circumstances to require the patent owner to license others on reasonable terms as provided for by the terms of Contract No. N00014-90-C-0219 awarded by the Office of Naval Research.

This application is a continuation, or of application Ser. No. 07/717,305 filed Jun. 17, 1991 now abandoned which is a continuation-in-part application of Ser. No. 07/518,004, filed May 2, 1990 and issued Jun. 18, 1991 as U.S. Pat. No. 5,024,993.

BACKGROUND OF THE INVENTION

1. Field of the Invention.

The present invention relates to hybrid circuits which comprise both superconducting and semiconducting devices, and also relates to hybrid circuits which comprise semiconducting devices, superconducting devices and hybrid superconducting-semiconducting devices. More particularly, this invention relates to the application of these combinations of devices in novel circuits to perform the function of random access memory.

2. Description of the Related Art.

There are three main areas of related prior art. The first is the prior art on superconducting-semiconducting circuits which is described in the U.S. patent application Ser. No. 07/518,004 titled "Superconducting-Semiconducting Circuits, Devices and Systems" by the present inventors and which has been allowed by the United States Patent and Trademark Office, and in a second U.S. patent application Ser. No. 07/638,911 by the present inventors, titled "Hybrid Superconductor-Semiconductor Crossbar Circuit". Issues concerning interconnection circuits are also described in U.S. Pat. No. 4,980,580, titled "CMOS Interconnection Circuit" by Ghoshal and a related publication, U. Ghoshal, "CMOS Inter-Chip Interconnection Circuit Using High-Tech Superconducting Tunnel Junctions and Interconnections," IEEE Electron Device Letters, vol. 10, pp. 373–76, August 1989.

The second area of prior art includes all the extensive literature on semiconductor memory circuits. The state-of-the-art circuit techniques in semiconductor dynamic random access memories are summarized in a recent publication, K. Itoh, "Trends in Megabit DRAM Circuit Design," IEEE I. Solid-State Circuits, vol. 25, pp. 778–89, June 1990, whereas recent literature about other types of semiconductor memories can be found in the October 1990 issue of the IEEE Journal of Solid-State Circuits. Some issues regarding low temperature operation of CMOS memory circuits at 77 kelvins are described in the publications: T. Chappell, S. Schuster, B. Chappell, J. Allan, J. Sun, S. Klepner, R. Franch, P. Greier and P. Restle, "A 3.5 ns/77 K. and 6.2 ns/300 K. 64K CMOS RAM with ECL Interfaces," IEEE J. Solid-State Circuits, vol. 24, pp. 859–67, August 1989; and R. Jaeger and T. Blalock, "Quasi-Static RAM Design for High Performance Operation at Liquid Nitrogen Temperature," Cryogenics, vol. 30, pp. 1030–35, December 1990.

The third area of related prior art is the technical literature on superconducting Josephson memory circuits. The early designs by the IBM group have been summarized in H. Zappe, "Memory-Cell Design in Josephson Technology," IEEE Trans Electron Devices, vol. ED-27, pp. 1870–82, 1980 and in S. Faris, "Basic Design of a Josephson Technology Cache Memory," IBM J. Res. Develop. vol. 24, pp. 143–66, 1980. Recent demonstrations and designs are summarized in the review article Wada, "Josephson Memory Technology," Proc. IEEE, vol. 77, pp. 1194–1207, 1989.

The first area of the related art describes the utility of combining superconducting devices and semiconducting devices preferably, but not necessarily, in the same integrated circuit chip. Specifically, the above-mentioned U.S. patent application Ser. No. 07/518,004 describe how it is possible to construct an amplifier from conventional CMOS transistors and Josephson devices that can provide amplification of Josephson-level voltages (typically of the order of 3 mV for low-temperature superconductors and of the order of tens of millivolts for high-temperature superconductors) to the voltage levels useful as inputs to conventional CMOS circuits (of the order of hundreds of millivolts). The amplifiers described in the patent application and publication occupy a small area and have short delays.

Another part of the related prior art on hybrid superconductor-semiconductor circuits describes the utility of the presently available superconducting field effect transistors (SFETs) to be useful in practical circuits if the semiconductor-to-superconductor interface circuits are realized. See A. Kleinsasser and W. Gallagher, "Three-terminal devices," in Superconducting Devices, Eds. S. Ruggiero and D. Rudman, San Diego: Academic Press, 1990, Chapter 9, and T. Nishino, M. Hatano, H. Hasegawa, F. Murai, T. Kure, A. Kiraiwa, K. Yagi and U. Kawabe, "0.1 $\mu$m gate-length superconducting FET," IEEE Electron Device Letters, vol. 10, pp. 61–63, February 1989. As described in U.S. patent applications Ser. Nos. 7/518,004 and 7/518,005, SFETs are devices which can both conduct a zero-voltage Josephson current, and also can be turned off (conduct only an insignificantly small current with a non-zero drain-to-source voltage drop) by application of a proper control voltage. Presently known SFETs cannot by themselves develop a sufficiently high voltage to provide the voltage necessary to control other SFETs, and thus lack the voltage gain to be useful as restoring ratioed logic gates. In complementary structures, SFETs might achieve voltage gain, but cannot achieve substantial performance improvements beyond the conventional CMOS devices. However, if the SFETs are used along with the CMOS amplifier circuits disclosed in U.S. patent application Ser. Nos. 7/518,004 and 7/518,005, novel pass-transistor circuits can be realized. The availability of the superconducting-to-semiconducting interface amplifiers is, therefore, important for making this expansion into a wider family of devices possible.

The second major part of the related art concerns semiconductor memory circuits. Memory circuits are circuits that can store information usually, but not necessarily, in a digital form. A memory circuit must also provide a means for retrieving the information. The information is stored at a site called the memory cell. There are two primary ways in which semiconductor circuits have been used to store binary data. One is the state of a bistable circuit commonly called the flip-flop, which typically consists of two inverter gates connected in a loop. The other primary method of storing binary information is as the presence or absence of charge on some node in the memory cell. See K. Itoh, "Trends in Megabit DRAM Circuit Design," IEEE I. Solid-State Circuits, vol. 25, pp. 778-89, June 1990, and U.S. Pat. No. 3,387,286, by Dennard. This latter method is commonly used in CMOS dynamic RAMs to achieve small area cells. Functional 64 Mb CMOS dynamic RAMs have been demonstrated recently and it is projected that 1 Gb CMOS memories will be possible by the end of this century. See T. Yamada, Y. Nakata, J. Hasegawa, N. Amano, A. Shibayama, M. Sasago, N. Matsuo, T. Yabu, S. Matsumoto, S. Okada, M. Inoue, "A 64 Mb DRAM with meshed power line and distributed sense amplifier driver," 1991 ISSCC Digest of Technical Papers, pp. 108-9, February 1991, and S. Mori, H. Miyamoto, Y. Morooka, S. Kikuda, M. Suwa, M. Kinoshita, A. Hachisuka, H. Arima, M. Yamada, T. Yoshihara, S. Kayano, "A 45 ns 64 Mb DRAM with a merged match-line test architecture," 1991 ISSCC Digest of Technical Papers, pp. 110-11, February 1991.

CMOS memory cells do not dissipate any power under quiescent conditions, whereas NMOS and bipolar memories dissipate small amounts of power. However, the major disadvantages of the semiconductor memories are the large delay and high power dissipation while accessing and retrieving information. The voltage levels required for storing and retrieving the information are of the order of volts for purely semiconducting memory circuits. The transistors in the memory cells have to be of minimum size so as to increase the memory capacity. However, small transistors have poor interconnection drive capability, and hence the transfer of information from the memory cells to the peripheral detection circuits becomes slow and inefficient. Even with elaborate schemes, the slow transfer of information from the memory cells to the peripheral circuits cannot be avoided in the case of dense memories. See K. Itoh, "Trends in Megabit DRAM Circuit Design," IEEE I. Solid-State Circuits, vol. 25, pp. 778-89, Jun. 1990.

The third major area of related prior art concerns low temperature (having a critical temperature less than 20 kelvins) superconducting memory circuits. In this area of the prior art, binary information is stored as either the presence or absence of a persistent circulating current in a superconducting loop which includes one or more Josephson devices. Alternatively, in some cases, information can be stored as the presence of either a clockwise or counter-clockwise circulating persistent superconducting current in a superconducting loop which includes one or more Josephson devices. The information stored in the cell can be accessed very rapidly and this is their primary advantage. However, operating margins for the superconducting memories are small and it is difficult to scale down the memory cell size without compromising the margins further. See H. Zappe, "Memory-Cell Design in Josephson Technology," IEEE Trans Electron Devices, vol. ED-27, pp. 1870-82, 1980 and Wada, "Josephson Memory Technology," Proc. IEEE, vol. 77, pp. 1194-1207, 1989. The largest fully functional superconducting RAM demonstrated thus far is 1 Kb; this is roughly four orders of magnitude less dense than the CMOS RAMs. See I. Kurosawa, H. Nakagawa, S. Kosaka, M. Aoyagi, S. Takada, "A 1-Kb Josephson Ram Using variable threshold cells," IEEE J. Solid-State Circuits, vol. 24, pp. 1034-39, August 1989.

The most common method of storing information in a superconducting loop is to store zero, one or two flux quanta. To store n flux quanta in a loop, the product of the loop inductance L and the critical current $I_c$ of the Josephson device must be equal to or greater than n $\phi_o$, where $\phi_o$ is the flux quantum and equals $2.07 \times 10^{-15}$ Wb. It is difficult in practice to make $I_c$ large and still retain the current-voltage characteristics of ideal tunnel junctions. This imposes a minimum value on L, which prohibits the memory cell from being chosen to be arbitrarily small, since the loop inductance is proportional to the perimeter of the loop. See H. Zappe, "Memory-Cell Design in Josephson Technology," IEEE Trans Electron Devices, vol. ED-27, pp. 1870-82, 1990; S. Faris, "Basic Design of a Josephson Technology Cache Memory," IBM J. Res. Develop., vol. 24, pp. 143-66, 1980; and C. Mead and L. Conway, Introduction to VLSI System, Reading, Mass.: Addison-Wesley Publishing Company, 1980, Chapter 9. These limitations are well understood by practitioners of the art. Storage of data in terms of such limited number of quanta also results in high bit error rates during detection. For high temperature superconductors (having critical temperatures greater than 20 kelvins) that are operated at high temperatures, for example, 77 kelvins, these considerations pose additional problems. The immature processes and the increase in thermal noise (which is proportional to absolute temperature) necessitate high values of the critical currents for the Josephson devices. Hence, the quiescent power dissipation in the peripheral circuits to address and access the cells is very large.

Memories cells are usually organized in a rectangular (X-Y) array and the state of a particular memory cell is determined by activating a particular word line (conventionally along the X direction) using row decoders and selecting the signal response on the bit lines (conventionally along the Y direction) using column decoders. In conventional CMOS memories, the transistors in the memory cells are of minimum size so as to maximize the cell density. See K. Itoh, "Trends in Megabit DRAM Circuit Design," IEEE I. Solid-State Circuits, vol. 25, pp. 778-89, Jun. 1990 and L. Glasser and D. Dobberpuhl, The Design and Analysis of VLSI Circuits, Reading, Mass.: Addison-Wesley Publishing Company, 1985, Chapter 7. When activated by the word line voltage signal, the state of the cell is transferred to the high capacitance bit lines through a small (high resistance) isolation/pass transistor. This transfer of information from the cell to the bit lines is slow because of the large RC time constants. In the case of dynamic RAMs, the charge on the small cell storage capacitor is shared with the large bit line capacitance and, hence, the bit line signal voltages are very small.

To avoid bit errors due to various noise sources, two bit lines are commonly used per memory cell and the small differential signals between the bit lines are detected by sense amplifiers, typically differential amplifiers. The signal detection by the sense amplifiers introduce additional delays and consume much power. In addition, the sense amplifiers have intrinsic voltage offsets and noise problems which limit their sensitivity. Because of these limitations, prior art CMOS designs sometimes include sophisticated schemes, which introduce additional delays, such as bit-line twisting and partitioning and duplication of sense amplifiers in large dynamic RAMs.

The 64 Mb DRAM built by researchers at Hitachi includes 64,000 sense amplifiers with power dissipation in the sense amplifiers reduced by self-timing the circuits. The read access time of such a memory was estimated to be 60 ns. A 1 Gb DRAM circuit based on such a design will need at least one million such sense amplifiers. See K. Itoh, "Trends in Megabit DRAM Circuit Design," IEEE I. Solid-State Circuits, vol. 25, pp. 778–89, June 1990. Thus, methods which eliminate the need for sensitive sense amplifiers, such as the ones disclosed herein with regard to the present invention, are extremely valuable.

Although there is no charge sharing between the cell and bit lines in static RAMs (SRAMs), the situation is similar to the DRAMs because these SRAM memories are mainly geared for higher speed operation. The RC charging times of the bit lines is unavoidable and it imposes a lower bound on the speed-power product of the memory circuit. To alleviate this problem, sensitive amplifiers using bipolar junction transistors (BiCMOS) have been used in recent designs in order to detect smaller bit line swings. The read access times of 1 Mb SRAMs has been scaled down from 8 ns to 5 ns using an advanced BiCMOS technology. The main drawback is the increased process complexity and power dissipation. Moreover, the sensitivity gains are limited because the RC charging times of the bit lines cannot be avoided. The advantages of BiCMOS technology over a pure CMOS technology is itself questionable when the channel lengths are scaled below 0N5 $\mu$m. The problems with both the DRAM and SRAM designs arise mainly due to the voltage-sensing schemes employed to detect small voltage signals on the bit lines.

Therefore, it is an object of this invention to provide novel circuits used in the function of random access memory, wherein the state of memory cells is detected without incurring and being dependent on the semiconductor memory drawbacks such as RC delay in the bit lines, and the need for sense amplifiers, and wherein the state of memory cells is detected without incurring the superconductor memory drawbacks such as the limitations of the size of the inductance loop, and high bit error rates. A further object of the present invention is to provide novel circuits used in the function of random access memory which not only eliminate the semiconductor memory and superconductor memory drawbacks, but also provide fast access times, wide operating margins and low power dissipation, and permit dense packing of the memory cells.

SUMMARY OF THE INVENTION

The present invention utilizes semiconductor circuits to store information, and either semiconductor or superconductor circuits, or combinations of superconducting and semiconducting circuits, with at least some superconducting circuitry used, to write and read information. The memory circuits of the present invention store information within the memory cell as charge and not as circulating currents as is the case for most superconducting memories.

The present invention eliminates the bit-line charging problems of the prior art by employing current-sensing schemes to detect currents in the bit-line. The present invention uses the low input impedance current devices and circuits from the superconductor technologies to detect the state of the memory cells without incurring the RC delay in the bit-lines. The superconducting devices and circuits can detect currents through the bit-line even if they do not development any DC voltage across them. In addition to eliminating the bit-line charging problems, these superconducting-semiconducting hybrid memory circuits achieve the benefits of both the semiconducting and superconducting technologies simultaneously. These benefits include the wide margins and dense packing of memory cells that are characteristic of semiconductor memories, and a low power dissipation and fast access times that are characteristic of the superconducting memories.

Two families of memory circuits are disclosed: (1) the voltage word-line (VWL) design, and (2) the current word-line (CWL) design. The VWL approach is ideal for high density RAMs with minimal use of superconducting components. In the VWL design, the state of the memory cell is retrieved by applying a voltage signal on the word-line. SFETs may be used in VWL designs to enhance the performance. The CWL design involves a greater mix of superconductor and semiconductor circuits. The state of the memory cell is retrieved by applying a current signal on the word-line and the bit-line, as is similar to prior art superconductor RAMs. Optimal CWL designs require the use of SFETs and other superconductor devices.

In order to use the advantageous superconductor-semiconductor hybrid memory circuits of the present invention with peripheral conventional semiconductor circuitry, interface circuitry is needed for converting superconducting signals to signals compatible with semiconductor circuits. Similarly, interface circuits are needed for converting semiconductor signals to signals compatible with superconducting circuits. The organization of the memory circuits depends significantly on the types of interface circuitry required.

The hybrid memories of the present invention can be fabricated by utilizing different combinations of prior art semiconductor and superconductor fabrication technologies.

BRIEF DESCRIPTION OF THE DRAWINGS

A better understanding of the present invention can be obtained when the following detailed description is read in conjunction with the following drawings in which:

FIG. 1 is a schematic drawing of a memory cell according to one of the current word-line embodiments of the present invention;

FIGS. 2a–2d are schematic drawings of memory cells according to different current word-line embodiments of the present invention;

FIG. 7a is a schematic drawing of a superconductor link circuit which can be used in accordance with the present invention;

FIG. 7b is a current versus voltage chacteristics diagram for a typical superconductor link;

FIG. 8 is a simplified schematic drawing of the readout circuitry for the FIG. 3b embodiment in accordance with the present invention;

FIG. 9a is a schematic drawing of one embodiment of read-write circuitry for the FIG. 3c embodiment in accordance with the present invention;

FIG. 17 is a simplified block diagram of the hierarchical organization of a 4 Mb hybrid random access memory in accordance with the present invention.

DETAILED DESCRIPTION OF THE INVENTION

Figure 2D:
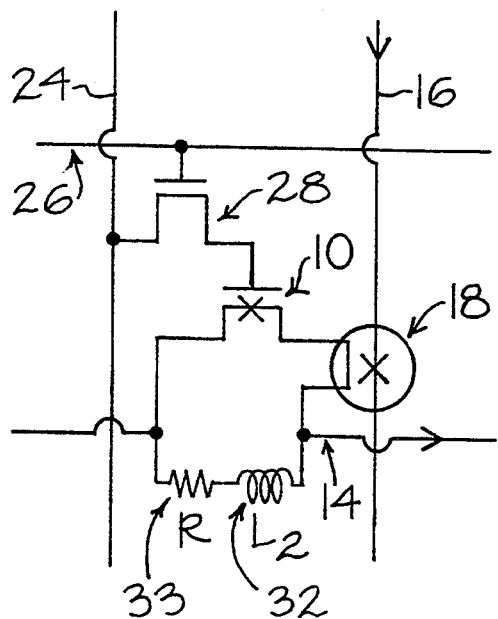

The prior art uses either purely semiconductor circuits or purely superconducting circuits to both store information, and to read and write information. In contrast, the present invention involves methods of using semiconductor circuits to store information, and either semiconductor circuits or superconductor circuits, or combinations of superconducting and semiconducting circuits, with at least some superconducting circuitry used, to write and retrieve information. These circuits permit the achievement of the virtues of both technologies simultaneously: wide margins and dense packing of memory cells that are characteristic of semiconductor memories, and low power dissipation and fast access times that are characteristic of superconducting memories. All of the memory circuits disclosed herein store the information within the memory cell as charge as in the case of CMOS memories and not as a circulating currents as in the case for most common Josephson memories.

This invention includes application to both low temperature superconductors (those whose critical temperature is less than 20 kelvins) and to high temperature superconductors (those whose critical temperature is above 20 kelvins). Preferred embodiments for both low and high temperature superconductors are specified.

The memories described herein can be used either in conjunction with cryogenic semiconductor logic, Josephson logic, or hybrid superconducting-semiconducting logic. To arrive at the optimum design of a RAM, several system and technology issues have to be considered. For example, Josephson device compatible inputs/outputs (I/Os) are useful for realizing low-power, high-speed system interconnection circuits using low characteristic impedance transmission (or high capacitance) lines. See U.S. Pat. No. 4,980,580, by Ghoshal; and U. Ghoshal, "CMOS Inter-Chip Interconnection Circuit Using High-Tech Superconducting Tunnel Junctions and Interconnections," IEEE Electron Device Letters, vol. 10, pp. 373–76, August 1989; and U. Ghoshal, H. Kroger and T. Van Duzer, "Superconductive Interconnection Circuits for Cryogenic Semiconductor Systems," Proceedings of the Symposium on Low Temperature Device Operation, vol. 91-1, Electrochemical Society, 1991, pp. 427–28. On the other hand, CMOS I/Os can be used in array systems where neighboring chips are connected with short high characteristic impedance links and effective capacitance loads are small. Although high temperature superconductors may also be used to realize low-power, high-speed interconnection circuits, this technology is presently not well developed. In the interim period, CMOS I/Os may be used for system interconnections in cases where operation at higher temperatures, say 77 kelvins, is necessary and only limited use of high temperature superconductor circuits may be advisable.

In the designs presented herein, the bit line charging problems of the prior art are totally eliminated by employing current-sensing schemes to detect currents in the bit line. Current-sensing methods have been attempted in SRAMs recently, but these methods do not give any major advantages over the voltage-sensing schemes in terms of delay and power. See E. Seevenick, P. J. van Beers and H. Ontrop, "Current-Mode Techniques for High-Speed VLSI Circuits with Applications to Current Sense Amplifier for CMOS SRAMs," IEEE Journal of Solid-State Circuits, vol. 26, pp. 525–36, April 1991. The inability of semiconductor devices, for example, CMOS, BJTs, HBTs, MESFETs, HEMTs, to reliably detect currents through low impedence elements at high speeds and low power is a consequence of the fundamental nature of these devices in that they are intrinsically voltage switches. See U. Ghoshal, H. Kroger and T. Van Duzer, "Superconductive Interconnection Circuits for Cryogenic Semiconductor Systems," Proceedings of the Symposium on Low Temperature Device Operation, vol. 91-1, Electrochemical Society, 1991, pp. 427–28; and C. Mead and L. Conway, Introduction to VLSI Systems, Reading, Mass.: Addison-Wesley Publishing Company, 1980, Chapter 9. The novel methods disclosed herein use the low input impedance current devices and circuits from the superconductor technologies to detect the state of the memory cells without incurring any RC delay in the bit lines. These superconducting devices and circuits can detect current through the bit line even if they do not develop any DC voltage across them. The bit lines develop signals of few millivolts during the transients.

Two families of memory circuits are disclosed. One is related to semiconductor memory designs and is termed voltage word line design or the VWL approach. The novel VWL design can be fabricated using conventional superconductor and semiconductor technologies. SFETs may be used in VWL designs to enhance performance, but the use of SFETs is not absolutely necessary. The VWL approach is geared for high density RAMs with minimal use of superconducting components. In the VWL design, the state of the memory cell is retrieved by applying a voltage signal on the word line, similar to conventional semiconductor RAMs. In a radical departure from conventional semiconductor designs, the currents in the bit line are sensed by superconducting devices and circuits.

The second type of memory circuit disclosed involves a more intimate mixing of the superconductor and semiconductor technologies and is termed current word line design, or the CWL design. CWL design requires SFET devices and greater use of superconductive electronics. In the CWL design, the state of the memory cell is retrieved by applying a current signal on the word line and the bit line, similar to prior art superconductor RAMs.

It must be noted that imperfect versions of both the CWL and VWL memories may be implemented by substituting FETs with very low drain-to-source resistance ($<50$ Ω) in the place of SFETs. However, such versions are not extendable to large memory arrays because of high power consumption and large access times.

1. Current Word Line (CWL) Design
(a) Basic Memory Cells of the CWL Design

FIG. 1 shows a novel CWL memory cell based on a CMOS cross coupled inverter pair of flip-flop 8 and two n-channel SFETs 10, 12. The circuitry needed to write information into the memory cell is omitted because the write procedure is similar to the conventional CMOS RAMs. Preferred embodiments of this approach are discussed below.

If a binary one is stored in the FIG. 1 embodiment, the node A is at a voltage which will enable upper SFET 10, enabling it to pass a zero-voltage current, and the node 3 is at a voltage which will disable the lower SFET 12, allowing only a negligibly small leakage current to flow through it. If a binary zero is stored in the memory cell, then the voltages at nodes A and B are reversed.

In the CWL approach, a memory cell is selected by applying a current concurrently through the selected word line 14 and the selected bit line 16. If a binary one is stored in the memory cell, then the entire word line current will flow through the source-to-drain junction of upper SFET 10 and be detected by current sensing superconducting Josephson junction device 18. The value of this word current must be less than the critical current of the SFETs so that the SFETs are not switched out of the zero-voltage state.

The current in the upper half of the loop is inductively coupled to the Josephson junction device (sense JJ) 18. Such inductive coupling is commonly used in Josephson junction circuits. The combination of the inductively coupled word line current and the bit line current through the sense JJ 18 are chosen so that the JJ will switch into the voltage state if and only if a binary one is stored in the memory cell. Furthermore, the values of the word current and the bit line current are chosen so that neither can separately cause the sense JJ 18 to switch out of the zero-voltage state. The current parameters necessary to ensure these results are dependent upon the characteristics of the particular JJ device. The specification of such parameters are matters within the ordinary skill in the art. If a zero is stored in the memory cell, all the word line current will flow through the lower half of the loop including SFET 12, and the current in the bit line flowing through the sense JJ 18 will not be sufficient to cause the JJ to switch out of the zero-voltage state.

If sense JJ 18 is switched to the voltage state, all the bit line current from the bit line driver at one side of the array is diverted to peripheral read-out circuitry, where the signal is detected by superconductive circuitry. These signal detection circuits can be any suitable conventional circuits used in prior art designs for superconducting RAMs, such as those disclosed in Wada, "Josephson Memory Technology," Proc. IEEE, vol. 77, pp. 1194–1207, 1989; and I. Kurosawa, H. Nakagawa, S. Kosaka, M. Aoyagi, S. Takada, "A 1-Kb Josephson RAM using variable threshold cells," IEEE J. Solid-State Circuits, vol. 24, pp. 1034–39, August 1989, the contents of which are herein incorporated by reference.

A particular virtue of this memory cell is that it can be read non-destructively. Applying the word line and bit line current has no effect upon the charge or information stored on the gates of the SFETs. A key feature which distinguishes the CWL memory cell from conventional Josephson RAMs is the absence of superconducting loops, which avoids problems of stray flux-trapping. Also, unlike other superconducting memories, the CWL memory can be easily scaled down in size because it does not store flux quanta and is not bound by any flux-quantization constraints.

(b) Preferred Circuit Embodiments of the CWL Design/Exploiting Enhanced Charge Storage Capability at Low Temperatures At temperatures below 100 kelvins, the leakage currents through MOSFETs in the off-state disappear. Theory predicts that this leakage current ($I_{leak}$) is proportional to the semiconductor intrinsic carrier density ($n_i$), which decreases exponentially with temperature:

$$I_{leak} \alpha n_i \alpha T^{1.5} \exp(-E_{go}/2kT).$$

In this equation, T is the absolute temperature, k the Boltzmann constant and $E_{go}$ is the semiconductor band-gap energy.

For silicon devices, the ratio of the junction leakage current at 77 kelvins to that at 358 kelvins (85° C.) is approximately:

$$I_{leak}(77 \text{ kelvins})/I_{leak}(358 \text{ kelvins}) = 3 \times 10^{-31}.$$

Since $I_{leak}$ (358 kelvins) is approximately equal to 10–100 nA, the value of $I_{leak}$ (77 kelvins) is approximately equal to $3-30 \times 10^{-31}$A, and $I_{leak}$ (77 kelvins) is essentially zero for practical purposes. Hence, if MOSFET-isolated capacitors are charged to any particular voltage, the capacitors can retain their charge throughout the lifetime of the memory circuit. See R. Jaeger and T. Blalock, "Quasi-Static RAM Design for High Performance Operation at Liquid Nitrogen Temperature," Cryogenics, vol. 30, pp. 1030–35, December 1990; and S. Hanamura, M. Aoki, T. Masuhara, O. Minato, Y. Saki and T. Hayashida, "Low-temperature CMOS 8×8 bit multipliers with sub-10 ns speeds," IEEE Trans Electron Devices, vol. ED-34, pp. 94–100, January 1987.

By exploiting this phenomena, the cross-coupled CMOS inverter pair 8 (FIG. 1) can be replaced by a simple CMOS inverter 20 and the charge can be stored on the gate capacitance of one of the SFETs 10 or 12 (FIG. 2a). The main advantage of such an implementation will be the smaller memory cell area.

The inverter 20 itself can be eliminated if we replace one of the n-channel SFETs 10, 12 (FIG. 1) with a p-channel SFET 22 such as shown in FIG. 2b. The p-channel SFET 22 conducts the zero-voltage channel current when the gate-to-source voltage of the p-channel SFET is low. With this modification, the number of transistors per CWL memory cell is reduced to three. This memory cell is labelled as the 3-T/CWL cell.

FIG. 2b also illustrates the conventional MOS circuitry needed to write information into the cell. When a sufficient voltage is applied to write word line 26, NMOS transistor 28 is enabled and charge from write bit line 24 is stored in the gate capacitance of the upper N-channel SFET 10. A binary one is written or stored when the gate capacitance is charged to a voltage greater than the threshold voltage of SFET 10. A binary zero is stored if the write bit line 24 is grounded and the gate capacitance of N-channel SFET 10 is discharged.

The p-channel SFET 22 can be eliminated from the cell if the word line loop is made asymmetrical as shown in FIG. 2c. The inductance in the SFET branch ($L_1$) (not illustrated) must be smaller than the inductance $L_2$ 30 of the other branch. The branch inductance $L_1$ includes the additional inductance due to the SFET 10 and the inductive loading of the sense JJ 18. If $L_2 = \beta L_1$, the current through the word line is chosen such that the fraction $\beta/1+\beta$ of the word line current is less than the critical current of the SFET 10. Furthermore, the sense JJ 18 must be designed such that only the combination of the fraction $\beta/1+\beta$ of the word line current applied inductively and the bit line current applied electrically will cause the sense JJ 18 to switch to the voltage state. These considerations do not limit the margins of operation or the scaling of these circuits to smaller dimensions. If a binary zero is stored in this cell, almost all of the current in word line is diverted through the inductor $L_2$ 30. A reasonable assumption is made that the critical currents of the interconnection lines are much greater than the critical currents of the SFETs. This two-transistor memory cell is labelled as the 2-T/CWL cell.

It is noted that the loop in the word line need not be superconducting. This is specially true in the case of the 2-T/CWL cell discussed above, since a normal metal interconnection in the lower branch opposite the upper branch that contains the SFET 10 could help in diverting all the current through the SFET if a binary one is stored and could eliminate the design uncertainty resulting from variation in values of the inductances. As in known by those skilled in the art, the power dissipation and noise margins have to be carefully evaluated, especially for the worst case in which all data stored in a particular column is binary zero. The 2-T/CWL cell as modified with a normal metal bypass inductor $L_2$ 32 and resistance 33 is shown in FIG. 2d.

Figures 4, 5:
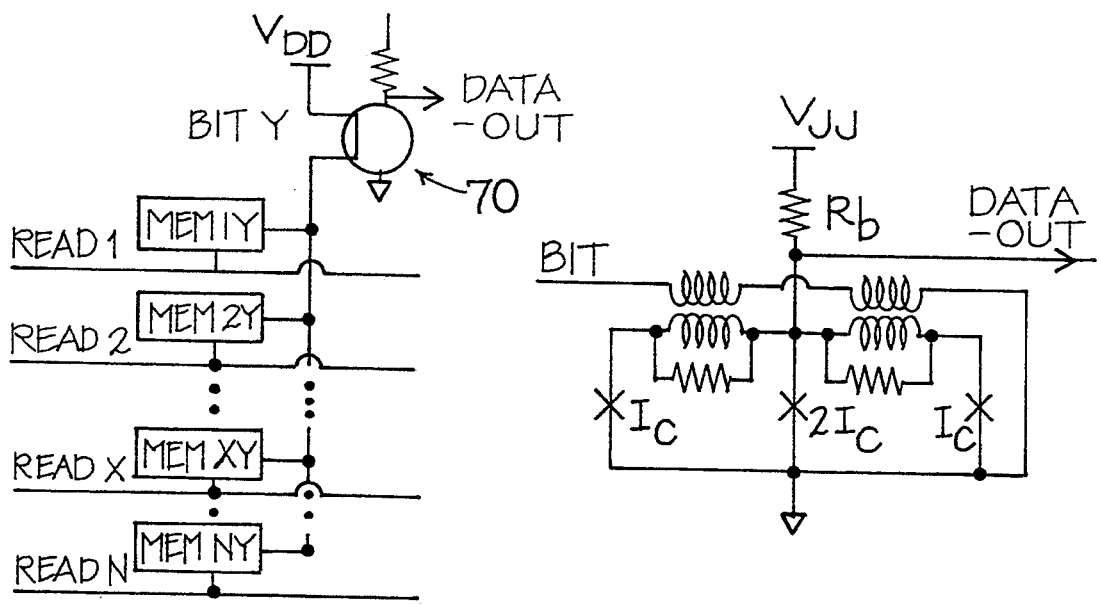
FIG. 4 is a simplified schematic drawing of the read-out circuitry for the FIG. 3a embodiment in accordance with the present invention.
FIG. 5 is a schematic drawing of a SQUID bit-line current detector which can be used in accordance with the present invention.

It is also noted that the sense JJ 18 in all the above designs can be a superconducting quantum interference device (SQUID), instead of being a single Josephson junction. See S. Hasuo and T. Imamura, "Digital Logic Circuits," Proc. IEEE, vol. 77, pp. 1177–93, August 1989, which is incorporated herein by reference. Use of a SQUID (sometimes called an interferometer), which consists of the parallel superconducting connection of two or more Josephson devices, could increase the sensitivity of the sense JJ 18 or permit wider margins for the read operation. SQUIDs are often used for such purposes in Josephson circuitry. However, SQUIDs may increase the memory cell area and may not be preferred in the design of dense memories. FIG. 5 illustrates a three-junction SQUID which can be used as a bit line current detector.

2. Voltage Word Line (VWL) Design (a) Memory Cell of the VWL Designs

The VWL designs were developed to solve the RC bit line charging problems in dense (1 Mb - 1 Gb) semiconductor memory circuits. The basic memory cells in the VWL design are similar to the cells in the semiconductor static and dynamic RAM cells designed for low temperature operation. See T. Chappell, S. Schuster, B. Chappell, J. Allan, J. Sun, S. Klepner, R. Franch, P. Greier and P. Restle, "A 3.5 ns/77 K. and 6.2 ns/300 K. 64K CMOS RAM with ECL Interfaces," IEEE J. Solid-State Circuits, vol. 24, pp. 859–67, August 1989, and R. Jaeger and T. Blalock, "Quasi-Static RAM Design for High Performance Operation at Liquid Nitrogen Temperature," Cryogenics, vol. 30, pp. 1030–35, December 1990. However, the manner in which the information in the memory cell is retrieved is radically different. For the reasons discussed above and in the references: R. Jaeger and T. Blalock, "Quasi-Static RAM Design for High Performance Operation at Liquid Nitrogen Temperature," Cryogenics, vol. 30, pp. 1030–35, December 1990, and S. Hanamura, M. Aoki, T. Masuhara, O. Minato, Y. Saki and T. Hayashida, "Low-temperature CMOS 8×8 bit multipliers with sub-10 ns speeds," IEEE Trans Electron Devices, vol. ED-34, pp. 94–100, January 1987, which are incorporated herein by reference, the charge stored on a MOSFET-isolated capacitor can be retained for the lifetime of the circuit at temperatures less than 100 kelvins, without the need for periodic refresh cycles.

Figure 3A:
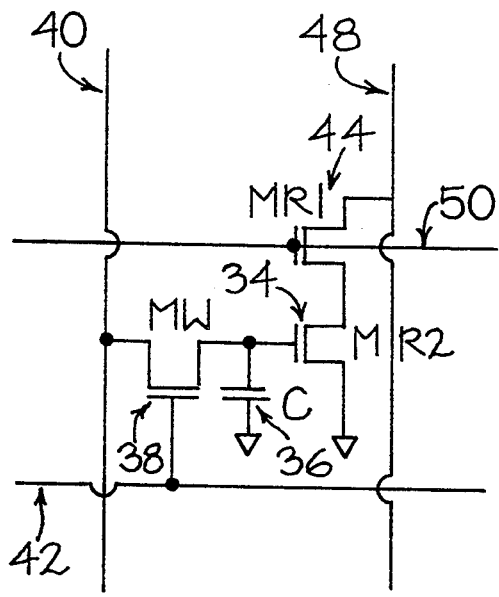
FIGS. 3a–3c are schematic drawings of memory cells according to different voltage word-line embodiments of the present invention.

A three-transistor VWL memory cell is disclosed in FIG. 3a. The information is stored as charge on the gate capacitance, illustrated as capacitor 36, of transistor 34 using conventional write-circuitry composed of the transistor 38 and the data-in bit and word lines 40 and 42. A binary one is stored in the cell if the capacitor 36 is charged to a voltage greater than the threshold voltage of transistor 34. If the capacitor 36 voltage is less than the threshold voltage of the transistor 34, a binary zero is stored in the cell. All the transistors in the memory cell are of minimum size, that is, the minimum geometry permitted by the fabrication process, so as to maximize the cell density. The data in the three-transistor memory cell is read-out by raising the voltage of the read word line above the threshold voltage of transistor 44 and sensing the resulting current through the bit lines as explained above with regard to the CWL designs. The read-out is non-destructive since it does not affect the charge stored on the capacitor 36. The 3-T RAM cells thus behave like conventional six-transistor static RAM cells at temperatures less than 100 kelvins, resulting in a three-fold increase in cell density without any sacrifice in performance.

Figure 3B:
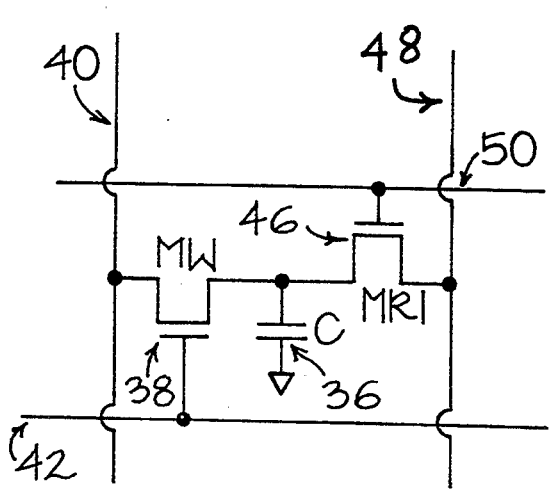

The number of transistors in the memory cell can be decreased further by allowing destructive read-outs similar to the purely semiconductor dynamic RAMs. FIG. 3b shows a two-transistor (2-T) memory cell designed for low temperature operation. The information is stored in the capacitor 36 in the same manner of the 3-T/VWL design (FIG. 3a). When the read word line 50 is raised above the threshold of transistor 46, and if a binary one is stored in the selected memory cell, the charge stored in the capacitor 36 decays by supplying a current to the read-out bit line 48. The density achieved by this 2-T memory cell array is the same as that of the purely semiconductor one-transistor (1-T) dynamic memory cells. This is because actual 1-T dynamic memory cells in purely semiconductor RAMs are organized in pairs (with a folded data line) so as to provide a differential output signal over a pair of read-out bit lines and eliminate common-mode noise sources. Differential read-outs are not necessary in the hybrid 2-T cell because of the wide margins resulting from efficient bit-line current sensing circuitry.

Figure 3C:
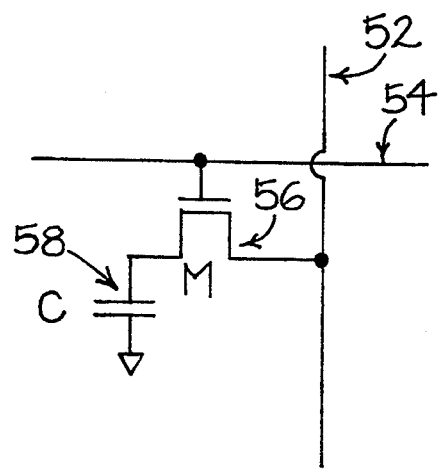

True one-transistor memory cells (FIG. 3c) can be realized in hybrid memories by using a common bit-line 52 and word-line 54 for retrieving and storing data into the memory cell comprising transistor 56 and capacitor 58. This poses certain additional complexity in the bit-line circuitry, which will be discussed below. If this design is realized in practice, the true 1-T memory cells will be the densest possible memory cell, with almost three-times the density of the present semiconductor dynamic RAM cells.

(b) Basic Read-Out Circuitry of the VWL Designs

In the VWL designs, the circuitry used to retrieve data from the memory cells differs radically from conventional prior art approaches since it eliminates the slow RC charging of the bit lines and the need for power-hungry and unreliable semiconductor sense amplifiers. The functioning of these read-out circuits is explained in terms of a simple read-out circuit shown in FIG. 4.

FIG. 4 shows the read-out circuitry for a column of a 3-T memory cell array. Mem1Y, Mem2Y, . . . , MemXY, . . . MemNY represent N different memory cells with a common data-out bit line Y. To access the information stored in a particular memory cell XY, the voltage of the read-word line ReadX is raised above the threshold of the transistor 44 (FIG. 3a) in the cell XY. If a binary one is stored in the cell XY, both transistor 44 and transistor 34 will conduct and there will be a conducting path from the supply to the ground through the bit line Y and the cell XY. If the transistors 34 and 44 are of minimum size, current approximately equal to 100–200 $\mu$A will flow through the read-out bit-line Y. If a binary zero is stored in the cell XY, the transistor 34 will not conduct and the cell XY will pose a very high impedance, greater than 100 M$\Omega$, to the bit line Y. If any particular memory cell, for example MemXY, is not selected, that is, the ReadX word line is at a voltage lower than the threshold voltage of the transistors 44 in cell XY, the cell XY will pose a very high impedance ($>$100 M$\Omega$) to the bit line Y.

When a cell with a binary one is selected, the transistors 34 and 44 in the memory cell act like ideal current sinks because of their high impedance compared to the bit lines and because they are in the saturation region. The bit lines are high capacitance lines (10 pF/cm) with very low characteristic impedances. Hence, the current step originating from the memory cell XY appears at the superconducting current detector 70 almost instantly, with only a small delay. If L is the inductance of the bit line per unit length of the bit lines and C is the capacitance of the bit line per unit length, then the total delay in transferring the current signal from the memory cell to the superconducting current-detector 70 at one side of the array is less than $2\tau$ or $2d(LC)^{\frac{1}{2}}$. At least half of the current signal will reach the detector after $\tau$ seconds. For typical bit line geometries and materials, and d=2 mm, the time $\tau$ will vary from 20 to 40 ps. In contrast, for the same parameters, the time for transferring information from the memory cell to the sense amplifiers in conventional voltage sensing schemes is roughly 2(RC) or 40 ns. In practice, the transistor sizes in the memory cell are increased, thereby sacrificing density, and smaller RC time-constants are realized. However, the VWL approach not only eliminates this RC time constant but also reduces the power dissipated in charging and discharging the bit lines. The VWL approach accomplishes this without sacrificing density.

In the VWL design, superconducting current detectors such as sense JJs can be used to reliably detect the small read-out bit line currents (100–200 $\mu$A) at high speeds. In the case of hybridization with low temperature superconductor Nb or NbN technologies, any one of a wide variety of superconducting circuits can be used. However, simple circuits like SQUIDs (FIG. 5) or magnetically-coupled JJs will suffice in most cases. The delay in detecting current signals using superconductive components is negligible (approximately equal to 10 ps) compared to other circuits in the critical path. Alternative circuits for high temperature superconductor technologies will be discussed below.

Note that for superconductor-circuit compatible inputs/outputs (I/Os), at least one superconductor-to-semiconductor signal-conversion stage is necessary at the inputs so that the word line swings are CMOS-compatible. Similarly, in the case of CMOS-compatible I/Os, at least one superconductor-to-semiconductor signal-conversion is needed at the output. The signal conversion stage or impedance transformation necessary with superconductive electronics is justified as long as the power dissipation and delay in the signal-conversion stages are smaller than the power dissipation and delay in the purely semiconductor approach. In the present invention, the power dissipation and delay in the signal-conversion stages must be smaller than the power and delay in bit-line charging, semiconductor voltage-sense amplifiers and the semiconductor I/Os of the prior art purely semiconductive random access memories. The transformation is justifiable in the case of most on-chip high-capacitance buses longer than 1 mm and all off-chip interconnection circuits. See U.S. Pat. No. 4,980,580, by Ghoshal; U. Ghoshal, "CMOS Inter-Chip Interconnection Circuit Using High-Tech Superconducting Tunnel Junctions and Interconnections," IEEE Electron Device Letters, vol. 10, pp. 373–76, August 1989; and U. Ghoshal, H. Kroger and T. Van Duzer, "Superconductive Interconnection Circuits for Cryogenic Semiconductor Systems", Proceedings of the Symposium on Low Temperature Device Operation, vol. 91-1, Electrochemical Society, 1991, pp. 427-28. Memory circuits are good candidates for the use of superconductors because the impedance transformation is likely justified since in addition to the high bit-line capacitance, the driving transistors in memory cells are necessarily small and have high output impedance because of the size constraints.

(c) Preferred Circuit Embodiments of the VWL Design (i) 3-T/VWL Design (1) Bit-line current detectors with superconducting tunnel junction technology Although the number of transistors in the 3-T memory cell design presented above is not the minimum, the 3-T cells are very robust. The currents in the read-out bit-line are large enough to be reliably detected by a variety of superconducting tunnel junction circuits. There are no problems with noise currents coupling from adjacent cells since active read-out data lines are separated far apart. SQUIDs (FIG. 5), or any other magnetically-coupled Josephson junction circuits, 4JL gates, or MVTL gates (see S. Hasuo and T. Imamura, "Digital Logic Circuits," Proc. IEEE, vol. 77, pp. 1177–93, August 1989, which is incorporated herein by reference) can be used as the current-detectors. The operation of all these devices are well known to those skilled in the art.

At very low temperatures (4–10 kelvins), mature LSI Nb and NbN superconductor circuit technologies based on superconductor-insulator-superconductor (SIS) tunnel junctions exist. See Y. Tarutani, M. Hirano and U. Kawabe, "Niobium-based IC technologies," Proc. IEEE, vol. 77, pp. 1164–76, August 1989. The processes used to fabricate these devices are compatible with CMOS or semiconductor device processing. Fabrication considerations are discussed in more detail below. Superconducting tunnel junction technology is the preferred way to design hybrid circuits with low temperature superconductors. SIS tunnel junctions have not been realized with high temperature superconductor materials and there is doubt about their feasibility in large scale circuits. However, if such tunnel junctions are realized in the future and it is possible to hybridize the technology with semiconductors, the same low temperature superconductor circuits used for current detection can be fabricated using high temperature superconductors.

(2) Bit-line single flux quantum (SFQ) current-detector circuits

Figures 6A, 6B:
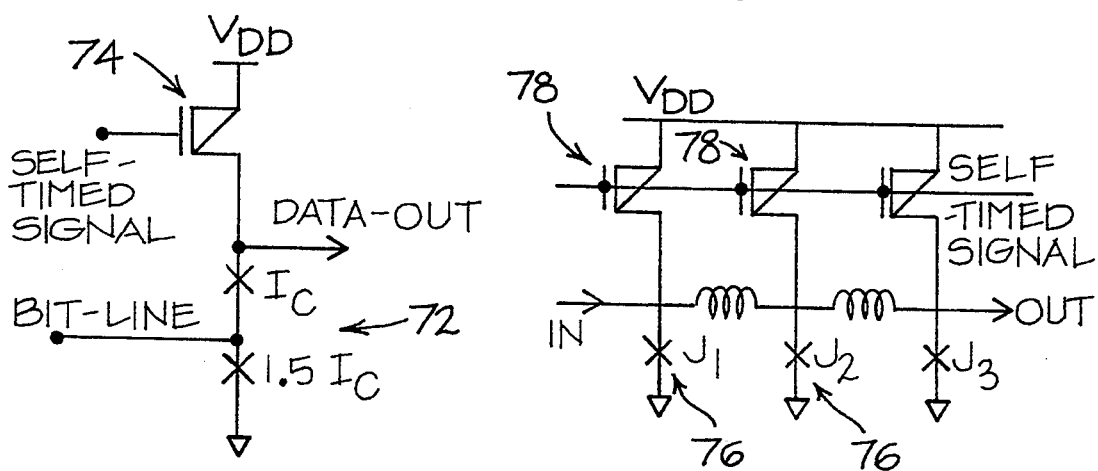
FIG. 6a is a schematic drawing of a rapid single flux quantum circuit which can be used in accordance with the present invention.
FIG. 6b is a schematic drawing of Josephson transmission lines which can be used in accordance with the present invention.

Assuming the existence of good Josephson junction technology, but not necessarily tunnel junctions, we can detect and amplify the small current pulses using the rapid single flux quantum (RSFQ) circuits proposed in the publication, K. K. Likharev, V. K. Semenov and A. B. Zorin, "New possibilities for superconductor devices," in Superconducting Devices, Eds. S. Ruggiero and D. Rudman, San Diego: Academic Press, 1990, Chapter 1, which is incorporated herein by reference. FIG. 6a illustrates a typical RSFQ buffer/amplifier stage 72 biased with a MOS transistor 74. The signal pulse can also be amplified and sharpened using Josephson transmission lines 76 biased by MOS transistors 78, as illustrated in FIG. 6b. The main purpose of the MOS transistors 78 is to provide a very high impedance current source and also to self-time the sources to reduce power in large memory circuits. The RSFQ circuits have to be supplemented by some form of voltage-state superconducting circuits, for example, fluxonic circuits discussed below, in order to provide efficient interface with the semiconductor devices.

(3) Bit-line current-detectors with fluxonic devices

At temperatures near liquid nitrogen, ideal superconducting tunnel junction circuits are presently difficult to realize. At these temperatures, the relaxation times for non-equilibrium effects such as excess quasi-particle population and flux transport within the superconductors get faster. There are a variety of fluxonic devices which can be used for current-detection, these include: (i) injection-controlled links, see A. Kleinsasser and W. Gallagher, "Three-terminal devices," Superconducting Devices, Eds. S. Ruggiero and D. Rudman, San Diego: Academic Press, 1990, Chapter 9, which is incorporated herein by reference; (ii) field-controlled links or cryotrons, see A. Frenkel, T. Venkatesan, C. Lin, X. Wu, M. Hedge, A. Inam and B. Dutta, "High-Tc superconducting film as a fast nonlinear switch for noise discrimination in digital circuits," Appl. Phys. Lett., vol. 53, pp. 2704–06, December 1988; and V. Newhouse, Applied Superconductivity, New York: John Wiley and Sons, 1964, Chapters 6 and 7, which is incorporated herein by reference; and (iii) other vortex-flow transistors, see J. S. Martens, D. S. Ginley, J. B. Beyer, J. Nordman and G. K. G. Hohenwarter, "A Josephson Junction to FET High-Speed Line Driver Made of TlCaBaCuO", IEEE Transactions on Magnetics, vol. 27, pp. 3284–3288, Mar. 1991, which is incorporated herein by reference. FIG. 7a illustrates a typical cryotron biased with a PMOS transistor 90.

The injection-controlled links and cryotrons are particularly beneficial because of their structural simplicity and ease in fabrication. There are two possible modes of operation for these circuits depending on whether the superconductor links (or gates in the cryotron terminology) of these circuits are operated in the intermediate-state or completely driven to the normal-state. A typical superconductor link 80 as a part of cryotron 81 is illustrated in FIG. 7a. The I-V characteristics and the operating points of typical superconductor links is shown in FIG. 7b. The intermediate state 86 is a mixed-state of the link in which magnetic flux vortices enter a superconductor link. The currents are just above the lower critical current $I_{c1}$ 82 of the link, but smaller than the upper critical current $I_{c2}$ 84. In the intermediate-state 86, the link develops a voltage but retains most of the superconductor properties. If the devices are operated by switching the link between the superconductor or intermediate-state 86 to the normal-state 88, the operating speeds of fully-semiconductor circuits is limited by the reverse transition of the link from the normal-state to the intermediate-state. However, if the current-biases of the links (such as link 80 in FIG. 7a) are self-timed using semiconductor transistors (such as PMOS transistor 90 in FIG. 7a) the links can be reset to the superconductor-state quickly and hence the performance of hybrid circuits are not affected. Granular links or ultra-thin superconductor links with high normal-state resistivities can be operated at high speeds when the link is not allowed to enter the normal-state. Cryotrons using such links (FIG. 7a) behave like the dual of semiconductor diodes and are termed fluxonic diodes. See A. Kadin, "Duality and fluxonics in superconducting devices," J. Appl. Phys., vol. 68, pp. 5741–48, December 1990.

(ii) 2-T/VWL Design

The read-out circuitry in the 2-T/VWL design, illustrated in FIG. 8, is similar to the 3-T/VWL design, except that the read-out bit line Y is grounded instead of being connected to the supply rail. When the read word line 50 (FIG. 3b) to the selected memory cell XY is high, and a binary one is stored in the selected memory cell, the stored charge in the capacitor 36 decays by supplying current to the read-out bit line 48 through the transistor 46. The transistor 46 acts like a non-linear resistor since the operating point moves from the saturation region to the linear region during the transistion. Assuming an effective resistance R approximately equal to 5 k$\Omega$, and the storage capacitor 36 approximately equal to 60 fF and charged to a voltage equal to 2 V, the maximum current in the bit lines 48 will be approximately $I_b$ or approximately V/R, or 400 $\mu$A, and the decay time for the current through the bit line will be $\tau_d$, or approximately RC, or 300 ps. All the current-detectors in the superconductor technology described above for 3-T/VWL designs can be used in the 2-T/VWL designs.

Various enhancements may be made to improve the operation margins. These include: (i) larger charge storage by increasing the capacitor voltage and the storage capacitance; (ii) boosting the read word line voltage; and (iii) using wider read-out transistors. All these methods are well-known to those skilled in the art. See K. Itoh, "Trends in Megabit DRAM Circuit Design," IEEE I. Solid-State Circuits, vol. 25, pp. 778–89, June 1990.

It is noted that 64 Mb 2-T/VWL hybrid memory designs are practical at present and that the density of these memories is closely linked to the density achievable by the fully semiconductor RAMs.

(iii) True 1-T/VWL Design

True 1-T/VWL designs have common bit-lines 52 and word-lines 54 (FIG. 3c) for both accessing data from the memory and storing data into the memory. During the read-outs, the bit-line 52 has to be grounded which poses a very low impedance to the memory cells. However, while writing data into the selected memory cell, the bit line 52 must be ideally an open-circuit, to allow charging of the memory cell capacitance to high voltages.

(1) Hybrids with superconducting tunnel junction technology

FIG. 9a shows a circuit using a stack 92 of Josephson tunnel junctions 93 biased with a PMOS transistor 94, which can achieve the desired read/write functionality for the true 1-T/VWL design. The critical currents $I_c$ of the Josephson junctions 93 in the stack 92 are equal and larger than the maximum read-out current $I_b$ through the bit-line 96. Superconductive current detector 99 is inductively coupled to bit line 96. The read-out procedure is exactly the same as discussed above because the junctions 93 in the stack 92 are in the zero-voltage state and the PMOS transistor 94 is disabled (poses a very high impedance, greater than 100 M$\Omega$). If a binary one is to be written into a selected memory cell in the column, write enable 98 is high and the output of NAND gate 100 is binary zero, the PMOS transistor 94 is enabled and the Josephson junctions 93 switch to the voltage state. The current through the junctions 93 is larger than $I_c$ and, therefore, each of the Josephson junctions 93 in the stack 92 behave like linear resistors with normal-state resistance $R_n$. The word line 95 is held at a low voltage during this time because of the delay through the decoder and the word line driver. Hence the voltage developed across the stack 92 and the bit-line charging depends entirely on the resistance $R_p$ of the PMOS transistor 94 and the normal-state resistance of the stack 92 of Josephson junctions 93 (N$R_n$). The overdrive currents in the Josephson junctions 93 cannot be much more than a few times the critical current $I_c$, if high reliability circuits are required. This constraint on the overdrive currents and the lower limit on the magnitude of the read-out bit-line currents lead to the requirement of a large number, greater than a hundred, Josephson junctions 93 in the stack 92.

Figures 9B, 9C:
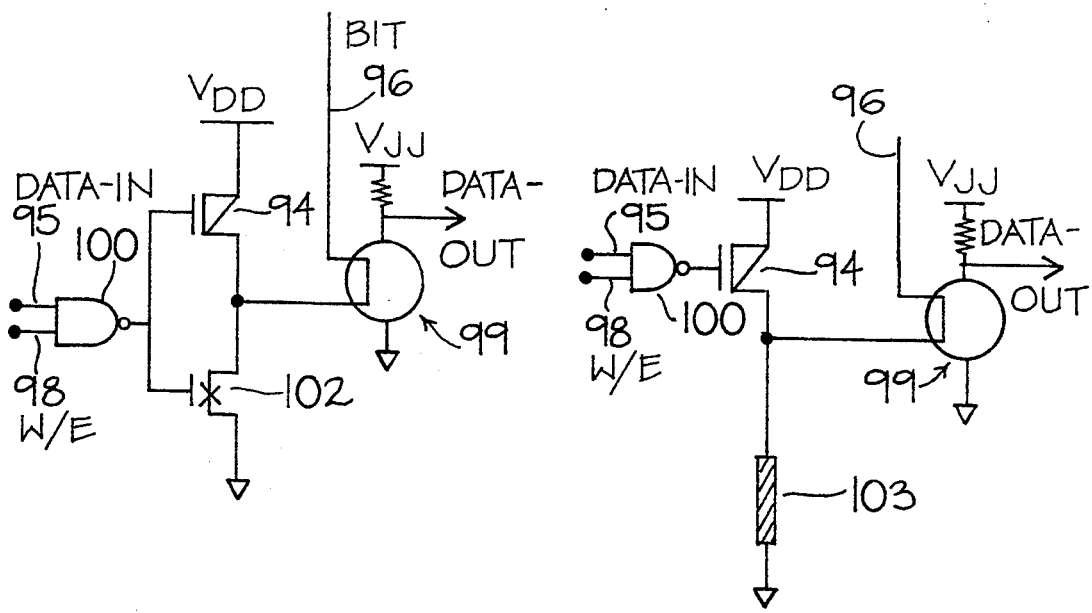
FIG. 9b is a schematic drawing of a second embodiment of read-write circuitry for the FIG. 3c embodiment in accordance with the present invention.
FIG. 9c is a third embodiment of read-write circuitry for the FIG. 3c embodiment in accordance with the present invention.

An SFET 102 can be used instead of the stack 92 of Josephson junctions 93, and the circuit in FIG. 9b results. During the read-out operations, the PMOS transistor 94 is disabled and the SFET 102 provides a zero-resistance path to ground as desired. The critical current of the SFET 102 must be larger than the read-out currents through the bit line 96. During the write operation, the SFET 102 is disabled and bit-line 96 can be charged to high voltages by the PMOS transistor 94.

(2) Hybrids with superconducting fluxonic devices

Figure 10:
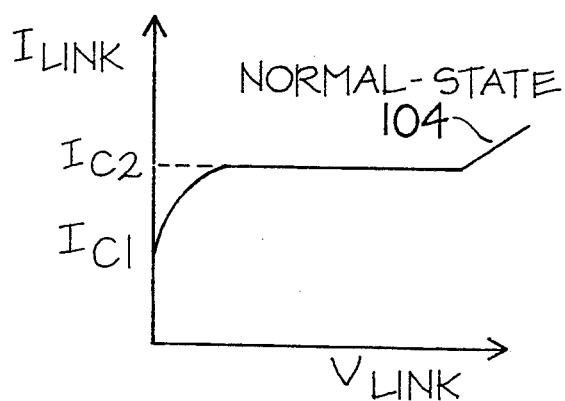
FIG. 10 is a current versus voltage characteristics diagram for a typical high temperature superconductor link.

A simple thin and narrow superconductor link, such as semiconductor link 103 illustrated in FIG. 9c, can replace the stack 92 of Josephson junctions 93 of FIG. 9a and achieve the desired performance. The normal-state resistance of the link 103 has to be large so as to maximize the capacitor voltage and minimize the power dissipation during the write operation. The link 103 can be made in principle from either low temperature superconductors or high temperature superconductors, although normal-resistivity materials and granular films characteristic of high temperature superconductors are ideal for this application. The I–V characteristics of such a superconductor link circuit is illustrated in FIG. 10. During the read operation, the PMOS transistor 94 is disabled. Hence, if the critical current $I_{c1}$ of the link 103 is greater than the read-out bit-line current, the bit-line 96 is effectively shorted to ground. During the write operation, the PMOS transistor 94 sources enough current (greater than $I_{c2}$) so that the link 103 switches to the normal state 104, loses superconductivity and poses a high impedance. The bit-line 96 can thus be charged to high voltages. Such links have been reported in literature and may be very useful in memory and interconnection circuits operated near liquid nitrogen temperatures. See A. Frenkel, T. Venkatesan, C. Lin, X. Wu, M. Hegde, A. Inam and B. Dutta, "High-Tc superconducting film as a fast nonlinear switch for noise discrimination in digital circuits," Appl. Phys. Lett., vol. 53, pp. 2704–06, December 1988; and A. Frenkel, T. Venkatesan, C. Lin, X. Wu and A. Inam, "Dynamic Electrical Response of YBaCuO," Journal of Applied Physics, vol. 67, pp. 3767–3775, January 1990, which are incorporated herein by reference.

3. Fabrication Issues

The hybrid memories can be implemented with many different combinations of semiconductor and superconductor technologies. However, at the present time, the hybrid memories based on CMOS technology and low temperature superconductors are easier to realize because their fabrication processes are compatible, low cost and manufacturable. High-performance low temperature superconducting tunnel junction circuits have been routinely fabricated on silicon wafers using low temperature processes. The highest processing temperature encountered in the processing of Nb circuits is typically 150° C., which is used for photo-resist baking. Thus, Nb and NbN Josephson circuits can be added onto CMOS circuits at the end of all CMOS processes, without affecting the performance or the behavior of the CMOS circuits. SFETs and MOSFETs with Nb gate and Nb source/drain metallization and superconducting delay lines have been previously fabricated before and, therefore, process compatibility is expected.

The non-planarity of semiconductor devices onto which Nb or NbN Josephson devices and circuits will be deposited also is not a concern. The apparent problem created by non-planarity can be circumvented in two ways. One way involves increasing the area of the chip by allowing the Josephson junctions to be placed over plane regions of the substrate. It is not a problem to have the niobium interconnection metallization adequately cover relief as is disclosed in D. Jillie, L. Smith, H. Kroger, L. Currier, R. Payer, C. Potter and D. Shaw, "All-refractory Josephson logic circuits," IEEE J. Solid-State Circuits, vol. SC-18, pp. 173, 1983, which is incorporated herein by reference. Alternatively, it is possible to deposit insulators, like polyimide that can be planarized over the semiconductor circuits, and subsequently deposit functional Josephson circuits on top of the polyimide. The planarization of dielectrics like polyimide has been demonstrated at Microelectronics and Computer Technology Corporation, and the fabrication of Josephson junction circuits over polyimide have been demonstrated by Fujitsu. The following references relate to the above-mentioned fabrication issues, and are incorporated herein by reference: T. Nishino, M. Hatano, H. Hasegawa, F. Murai, T. Kure, A. Kiraiwa, K. Yagi and U. Kawabe, "0.1 $\mu$m gate-length superconducting FET," IEEE Electron Device Letters, vol. 10, pp. 61–63, February 1989; M. Delaney, R. Withers, A. Anderson, J. Green and R. Mountain, "Superconductive delay line with intergral MOSFET taps," IEEE Trans. Magnetics, vol. MAG-23, pp. 791–95, March 1987; D. Jillie, L. Smith, H. Kroger, L. Currier, R. Payer, C. Potter and D. Shaw, "All-refractory Josephson logic circuits," IEEE J. Solid-State Circuits, vol. SC-18, pp. 173, 1983; J. T. Pan, S. Poon and B. Nelson, "Copper/Polyimide Multichip Module," Proceedings of the Eighth Annual International Electronics Packaging Conference, pp. 174–189 (1988).

Various high temperature superconductors have been deposited over silicon, silicon dioxide and gallium arsenide. High-Tc superconductors have been deposited on silicon using dielectric buffer layers, using metallic buffer layers, and without using any buffer layers. See D. Fork, D. Fenner, A. Barrera, J. Phillips, T. Geballe, G. Connell and J. Boyce, "Buffer Layers for High-Quality Epitaxial YBCO Films on Si," IEEE Transactions on Applied Superconductivity, vol. 1, pp. 67–73, March 1991, which is incorporated herein by reference. However, the lowest processing temperature has been about 550° C., a temperature which makes it difficult to add superconductors onto semiconductor circuits after the semiconductor processes are complete. Hybrids with high temperature superconductors will need intimate mixing of the semiconductor processes with superconductor links if the superconductors can be deposited just after the completion of semiconductor diffusion processes and low temperature semiconductor processes are subsequently used to fabricate semiconductor devices. Deposition and passivation of high temperature superconductor wires with silicon dioxide has already been demonstrated. See T. S. Kalkur, R. Kwor and D. Byrne, "Effect on an $SiO_2$ layer on the superconductive properties of the high-Tc Bi—Sr—Ca—Cu—O films," Journal of Applied Physics, vol. 67, pp. 918–20, January 1990, which is incorporated herein by reference. Thus, it might be possible to hybridize high temperature superconductor injection-controlled links, cryotrons and other fluxonic devices with CMOS devices in the future.

Although SFET devices and complex superconducting tunnel junction circuits have been demonstrated using low temperature superconductors (see A. Kleinsasser and W. Gallagher, "Three-terminal devices," in Superconducting Devices, Eds. S. Ruggiero and D. Rudman, San Diego: Academic Press, 1990, Chapter 9 and T. Nishino, M. Hatano, H. Hasegawa, F. Murai, T. Kure, A. Kiraiwa, K. Yagi and U. Kawabe, "0.1 $\mu$m gate-length superconducting FET," IEEE Electron Device Letters, vol. 10, pp. 61–63, February 1989), there has been very little success in realizing these devices and circuits using high temperature superconductors. Various papers describing the operation of high temperature superconductors tunnel junctions at very low temperatures (less than 10 kelvins) have been reported in recent literature, see A. Pargellis, F. Shariff, R. Dynes, B. Miller, E. Hellman, J. Rosamilia and E. Hartford, "All-High Tc Josephson Tunnel Junction: BaKBiO/BaKBiO junctions," Applied Physics Letters, vol. 58, pp. 95–96, January, 1991, which is incorporated herein by reference, but fabrication of large scale circuits using these devices is still uncertain and may never be possible at higher temperatures.

Finally, it is noted that wafer-scale memories and multi-chip implementations of hybrid memories are also possible. Single-chip implementations usually result in lower cost and higher performance. However, multi-chip systems allow the easy implementation of sub-circuits, for example interface circuits, and permit hybridizing incompatible or immature device technologies.

4. Memory Organization

In the following discussions about decoders, interfaces and memory organizations, the term JJ represents all types of superconducting circuits, including superconducting tunnel junction circuits, cryotron circuits and other fluxonic devices. The abbreviation su→sm will be used to denote interface circuits needed for converting superconducting signals to signals compatible with semiconductor circuits. Similarly, sm→su is used to denote interface circuits needed for converting semiconductor signals to signals compatible with superconducting circuits.

Decoders can be implemented with either purely semiconductor circuits or purely superconductor circuits or hybrid semiconductor-superconductor circuits. Decoders implemented using JJs are the fastest circuits reported, although the quiescent power dissipation for high-speed decoding is relatively high. See Wada, "Josephson Memory Technology," Proc. IEEE, vol. 77, pp. 1194–1207, 1989. For example, a 6-bit decoder in the presently most successful 1 Kb Josephson RAMs operating at 4 kelvins, has a delay of about 200 ps, not accounting for the time for resetting the Josephson junction circuits, and has a quiescent power dissipation of 1.1 mW. See I. Kurosawa, H. Nakagawa, S. Kosaka, M. Aoyagi, S. Takada, "A 1-Kb Josephson RAM using variable threshold cells," IEEE J. Solid-State Circuits, vol. 24, pp. 1034–39, August 1989. CMOS decoders have zero quiescent power dissipation but larger delays. 7-bit NOR decoders for addressing 16 Kb arrays in IBM's 64 Kb CMOS memory have delays of about 500 ps at 77 kelvins. See T. Chappell, S. Schuster, B. Chappell, J. Allan, J. Sun, S. Klepner, R. Franch, P. Greier and P. Restle, "A 3.5 ns/77 K. and 6.2 ns/300 K. 64K CMOS RAM with ECL Interfaces," IEEE J. Solid-State Circuits, vol. 24, pp. 859–67, August 1989. Recent breakthroughs in ultra-thin SOI CMOS and the continuing trends of reduced channel lengths are expected to shorten the decoder delay times considerably and make them comparable to JJ decoders. See M. Aoki, T. Ishi, T. Yoshimura, Y. Kiyota, S. Iijima, T. Yamanaka, T. Kure, K. Ohyu, T. Nishida, S. Okazaki, K. Seki and K. Shimohigashi, "0.1 $\mu$m CMOS devices using low impurity channel transistors," 1990 IEDM Digest of Technical Papers, pp. 939–41, December 1990; G. Shahidi, B. Davari, Y. Taur, J. Warnock, M. Wordeman, P. McFarland, S. Mader, M. Rodriguez, R. Assengza, G. Bronner, B. Ginsberg, T. Lii, M. Polcari and T. Ning, "Fabrication of CMOS on ultra-thin SOI obtained by epitaxial lateral overgrowth and chemical-mechanical polishing," 1990 IEDM Digest of Technical Papers, pp. 587–90, December 1990; and P. K. Vasudev, "Ultrathin SOI for high speed submicrometer CMOS technology," Solid State Technology, pp. 61–65, November 1990.

Figure 11:
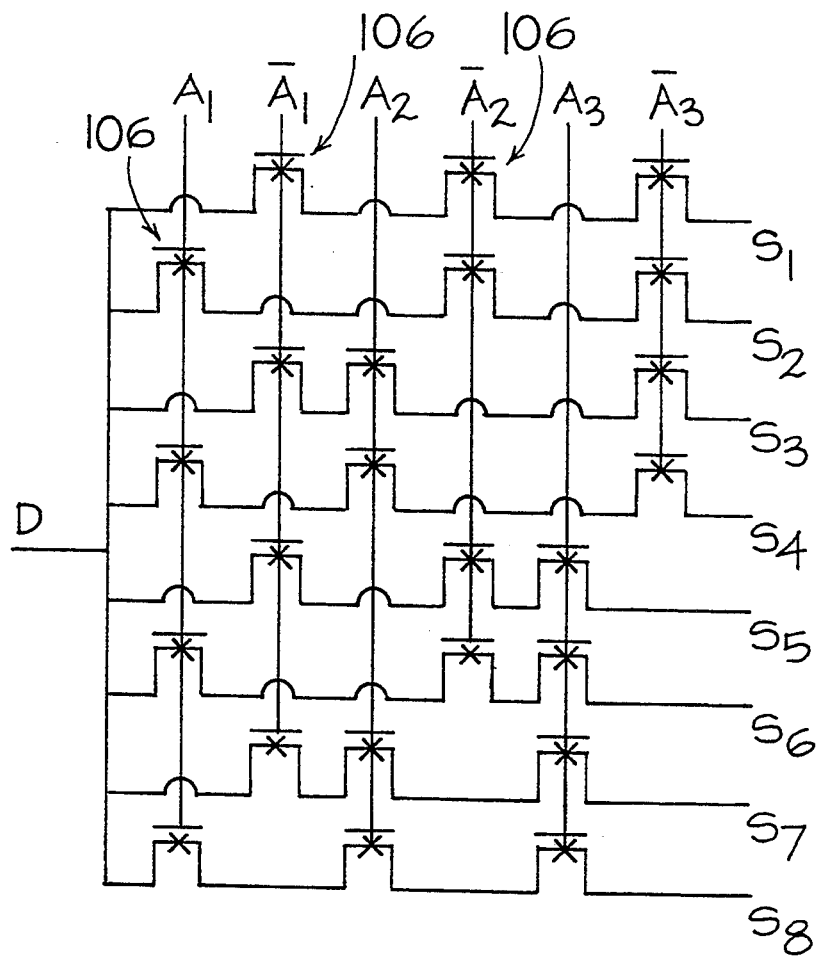
FIG. 11 is a schematic drawing of a SFET selector circuit in accordance with the present invention.
Figure 12:
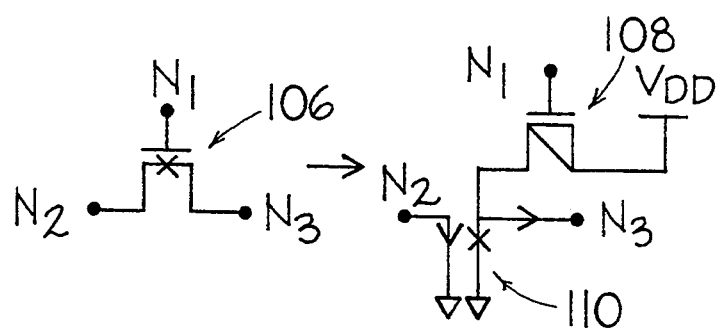
FIG. 12 is a schematic drawing illustrating a combination of a PMOS transistor and a JJ superconducting current switch as a substitution for each SFET in the FIG. 11 circuit.

Hybrid decoders can be built by using the selector circuits disclosed in U.S. patent application Ser. No. 07/518,004, by the present inventors, which is incorporated herein by reference. Since the disclosed SFET selector circuits are bilateral pass-transistor circuits, they can be used to decode addresses as well as multiplex data. An example of a SFET selector circuit which can function as a 3-bit decoder or a multiplexor is illustrated in FIG. 11. Depending on the binary address voltages ($A_1$, $A_2$, $A_3$) applied at the gates of the SFETs 106, one of the eight data-paths $DS_1$, $DS_2$..., $DS_8$, is chosen. As disclosed in U.S. patent application Ser. No. 07/518,004, the gate voltages or addresses are assumed to be generated by CMOS circuits and the zero-voltage data-path currents are assumed to be smaller than the critical currents of the SFETs 106. The flow of information in the selector circuit is from left to right for decoding, and vice versa if a multiplexing function is desired. As disclosed in U.S. patent application Ser. No. 07/518,004, there are no RC delays along the data path and there is no power dissipation in the selector switches. Hybrid decoders can also be designed using only CMOS and JJ devices. For example, each SFET 106 in FIG. 11 can be substituted with a combination of a PMOS transistor 108 and a JJ superconducting current switch 110, as illustrated in FIG. 12. These types of hybrid decoders will dissipate power in the PMOS current sources and thus, will be useful only in self-timed decoders.

High-speed, low-power circuits to interface superconductor and semiconductor devices are essential for all hybrid memory circuits proposed herein. These circuits are disclosed in U.S. patent application Ser. No. 07/518,004. Superconductive interface circuits like series-parallel stacked array and flux-flow transistors have already demonstrated their capability to amplify the small voltages (3 mV) from the Josephson junction circuits to about 150 mV. See J. S. Martens, D. S. Ginley, J. B. Beyer, J. Nordman and G. K. G. Hohenwarter, "A Josephson Junction to FET High-Speed Line Driver Made of TlCaBaCuO", IEEE Transactions on Magnetics, vol. 27, pp. 3284–3288, March 1991; and H. Suzuki, A. Inoue, T. Imamura and S. Hasuo, "A Josephson driver to interface JJ to semiconductor transistors," 1988 IEDM Digest of Technical Papers, pp. 290–93, December 1988. These superconductive circuits occupy a large area and the bias circuits usually dissipate considerable power under quiescent conditions. However, the novel interface circuits based on threshold biasing of high-gain CMOS amplifiers disclosed in U.S. patent application No. 07/518,004 occupy smaller area and do not dissipate power under quiescent conditions. The conversions of signals from the semiconductor circuits to the superconductor circuits ($sm{\rightarrow}su$ interfaces) can be easily implemented without suffering any delay penalty or increased power dissipation by SFETs, as disclosed in the above patent application, and by direct interfacing.

Figure 13:
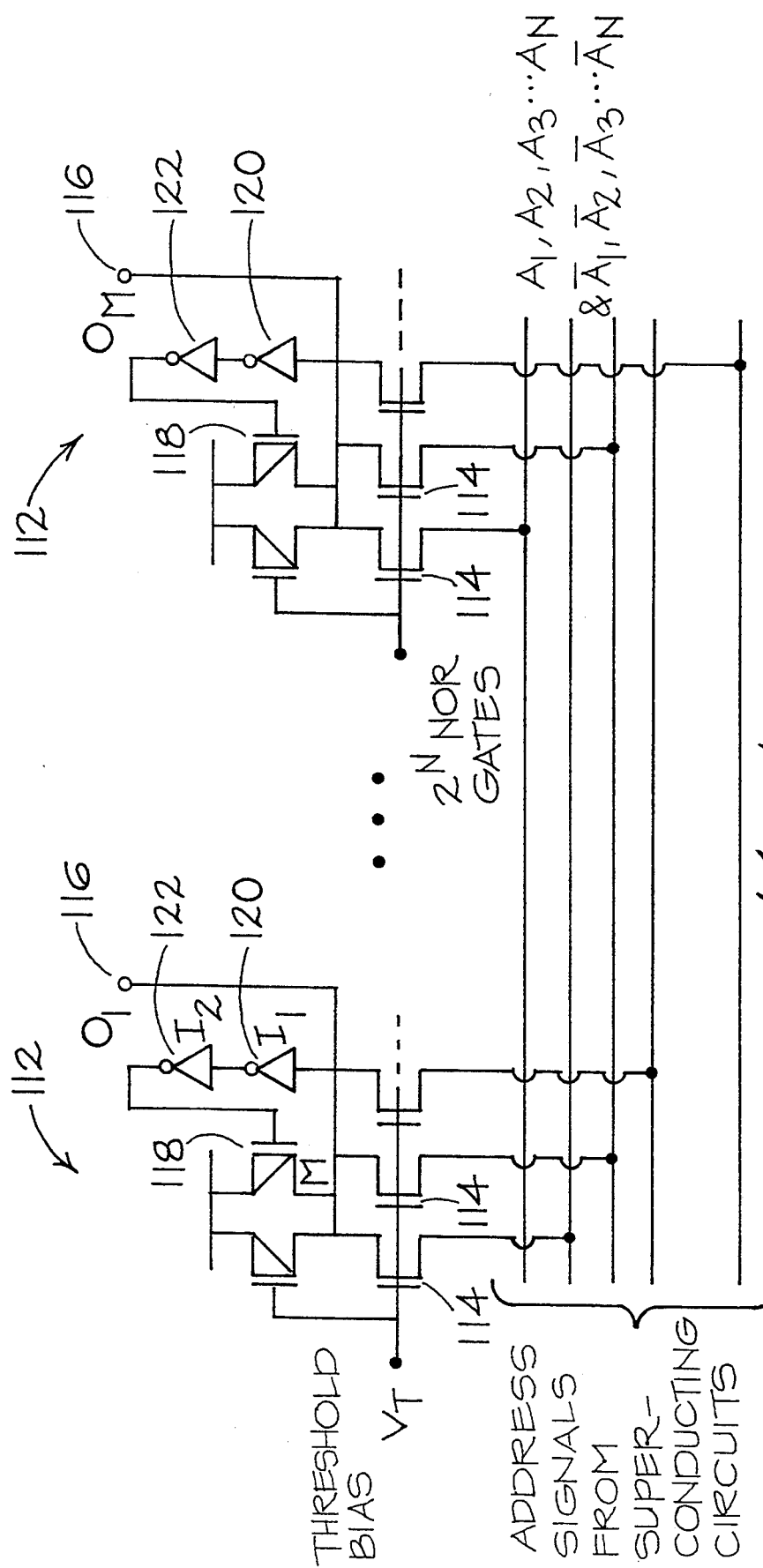
FIG. 13 is a simplified schematic drawing of an embodiment of a merged semiconductor to superconductor interface circuit in accordance with the present invention.

The interface circuits can also be merged into the decoders to reduce the complexity and delay. The SFET selector circuit in FIG. 11 actually performs the function of a $su{\rightarrow}sm$ interface as well as a decoder. An example of a merged $sm{\rightarrow}su$ interface circuit is the CMOS selector circuit illustrated in FIG. 13. Each of the CMOS NOR gates 112 are biased just above the threshold of the NMOS transistors 114 by either a microwatt threshold-bias circuit, see E. Vittoz and J. Fellrath, "CMOS Analog IC based on Weak inversion Operation," IEEE J. Solid-State Circuits, vol. SC-12, pp. 224–31, June 1977, which is incorporated herein by reference, or by the charge-biasing method disclosed in U.S. patent application Ser. No. 07/518,004. After the inputs from the superconductive circuits are applied to the N-bit decoder, and depending on the particular combination of the address data, only one of the $2^N$ output nodes 116 of the NOR-gates 112 remains precharged high, representing a binary one. The precharge of the output nodes 116 is performed with a self-timed inverter loop consisting of PMOS transistor 118 and two inverters 120 and 122. As long as the output of one of the NOR gates 112 is pre-charged to a high voltage, transistor 118 is disabled and poses a high impedance. If the output node 116 of a NOR gate 112 is discharged during a transition, the transistor 118 turns on after a delay $\tau$ and charges the output node back to high voltages. The time delay $\tau$ is controllable by the inverters 120 and 122 and can be made as long as needed. There are numerous other combinations of such intimate mergers of the interface circuit and decoders which can be designed by those skilled in the art.

For VWL designs, the charging of the word lines creates additional delays in the read-out path. Various methods like word-line partitioning, use of asymmetrical drivers, pre-charging and placing voltage offsets have been used in the prior art to reduce these time delays. These methods are well-known to those skilled in the art of conventional semiconductor RAMs.

The decision to use a particular kind of decoder or interface circuit depends mainly on the type of memory cell, the I/O compatibility requirements, and the size of the memory. The presently preferred organizations of the hybrid memories are discussed below, and numerous changes in the details of construction will be apparent to those skilled in the art. There are hundreds of different memory organizations possible with the functional blocks disclosed herein, and it is impossible to specify each of them. The aim of the following description is simply to illustrate design constraints and a few optimal organizations.

(a) Organization of Small Memories (less than or equal to 64 Kb)

The organization of small memory circuits significantly depends on the type of I/Os (JJ-compatible or CMOS-compatible) required. This is because the delays in $su{\rightarrow}sm$ interfaces become a significant fraction of the total access time in the case of high-speed memories. Hence, the number of $su{\rightarrow}sm$ interfaces should be minimized. It is noted that the time delays of the $sm{\rightarrow}su$ interface circuits are trivial and, therefore, do not increase the path delay.

There is a significant advantage in using JJ I/Os over other CMOS or ECL I/Os, especially when driving low characteristic impedance off-chip transmission lines, because there are no noise problems associated with simultaneous switching of JJ drivers, even at high speeds. These issues are discussed in U.S. Pat. No. 4,980,540 and in the publication: U. Ghoshal, H. Kroger and T. Van Duzer, "Superconductive Interconnection Circuits for Cryogenic Semiconductor Systems", Proceedings of the Symposium on Low Temperature Device Operation, vol. 91-1, Electrochemical Society, 1991, pp. 427–28. The elimination of the noise due to simultaneous switching of drivers may justify the use of hybrid memories for high-speed cache memory applications.

(i) CWL Designs With JJ-Compatible I/Os

Figure 14A:
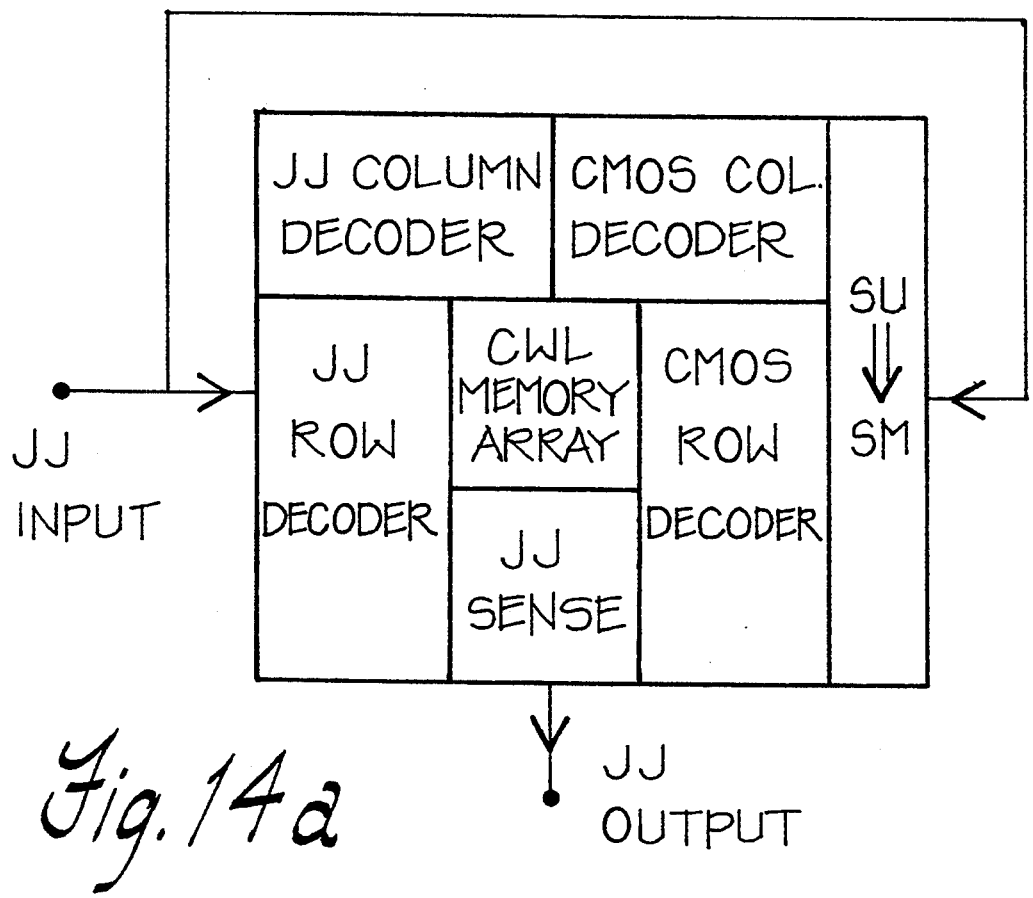
FIGS. 14a and 14b are simplified block diagrams of different memory organizations for the current word-line embodiments in accordance with the present invention.
Figure 14B:
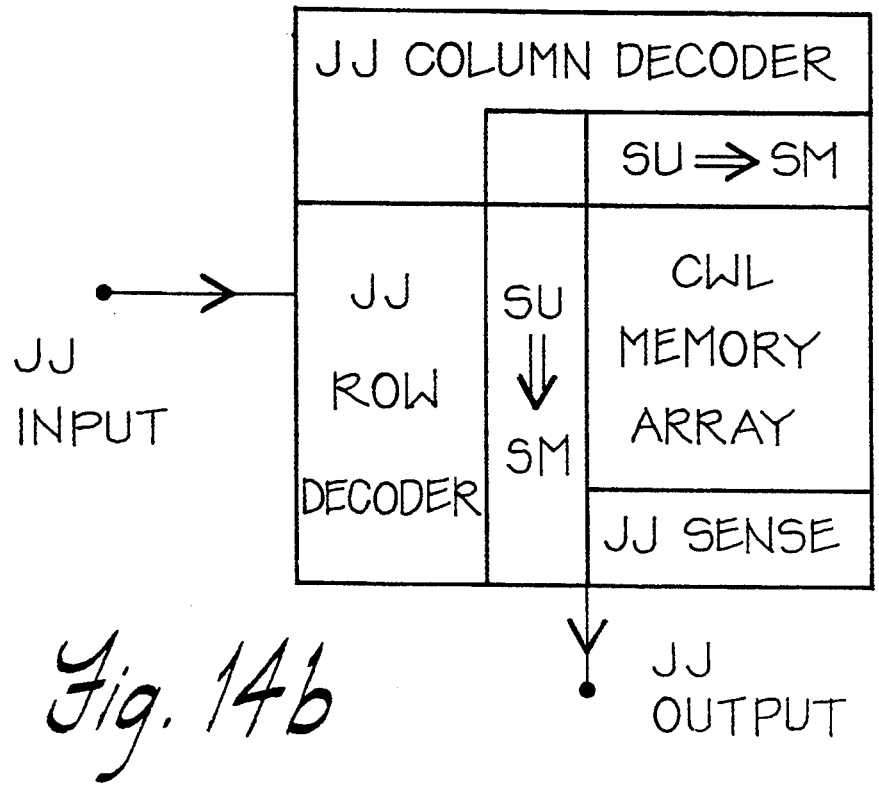

In this CWL design, the I/Os are JJ compatible and the CWL memory cells are addressed with currents. Hence, it is preferable to use JJ circuits throughout the read-out path. The decoders, addressing procedures and sensing methods for the read operations are similar to the conventional superconductor RAMs. There are no su→sm stages along the read-out data path and, therefore, these memory circuits are expected to be the fastest among all the hybrid memories proposed herein. In order to write data into the cell, at least one su→sm interface stage along the write-in path is needed. This su→sm stage can be placed at the input to minimize the number of interface circuits (FIG. 14a) and CMOS decoders can be used to transfer information into the cell. The shaded areas in FIG. 14a represent the write circuitry. Alternately, JJ decoders can be made common to both the read-out path and write-in path and the su→sm stage can be placed after the JJ decoders in order to write data into the memory, as represented by the shaded areas in FIG. 14b. In the first approach, N su→sm interface circuits are necessary for a memory of size $2^N$, while in the second approach, $2^{(N+2)/2}$ such interface circuits are required. The large number of interface circuits in the second approach is not a concern for power dissipation since the superconductive amplifiers in the interface circuits can share a common current bias and only one interface circuit along the row and column is activated at a given time. The CMOS circuits in the su→sm interfaces are assumed to dissipate negligible amount of energy in their quiescent state.

(ii) CWL Memories With CMOS I/Os

For CWL memories embedded in CMOS systems, the entire write-in path will be preferentially purely CMOS. Use of JJ decoders along the write-in path is not recommended because it will unnecessarily involve su→sm stages and increase the delay incurred in writing data into the cell. They will also increase the complexity of the design. Since the CWL memory cells are addressed by currents, and since sm→su interface circuit delays are trivial, anyone of the three types of decoders (CMOS, JJ or SFET) can be placed in the read-out path. At least one su→sm stage is necessary at the output in order to convert the signals from the JJ bit-line sensing circuits and to multiplex them to CMOS-compatible voltages at the outputs.

(iii) VWL Designs With JJ Compatible I/Os

Figure 15A:
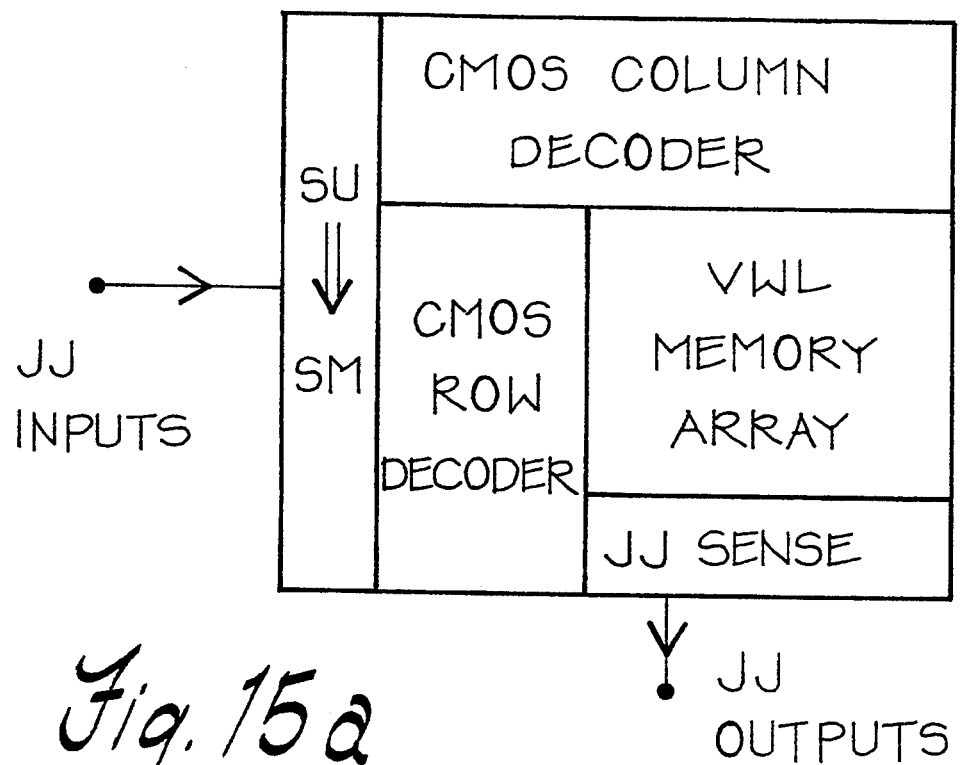
FIGS. 15a and 15b, and FIGS. 16a and 16b are simplified block diagrams of different memory organizations for the voltage word-line embodiments in accordance with the present invention.
Figure 15B:
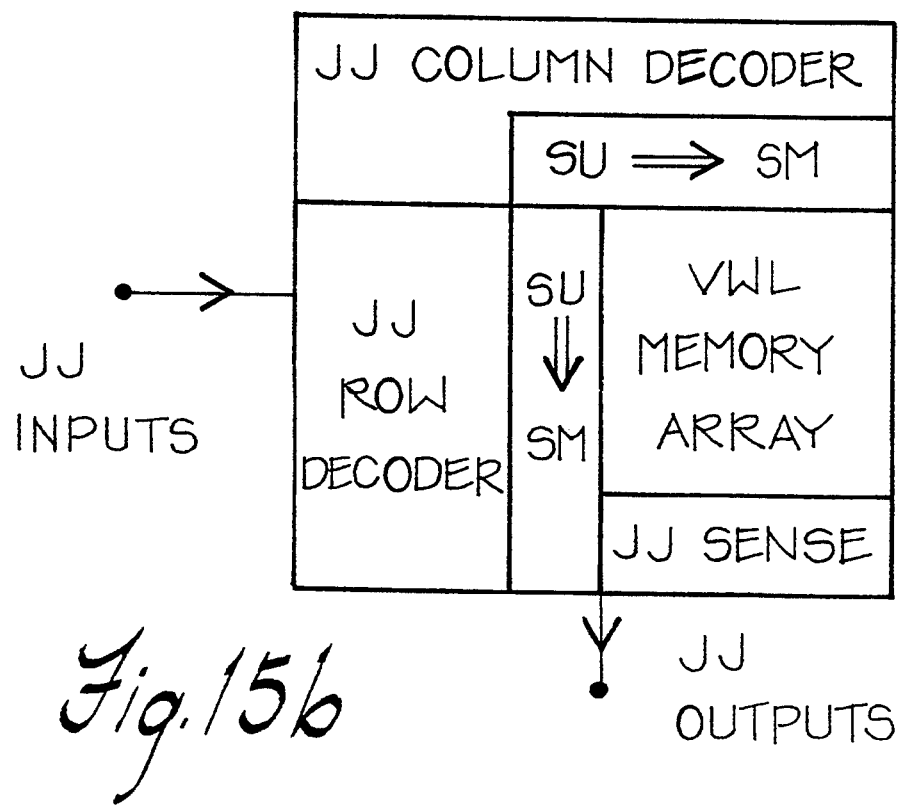

The simplest VWL memory organization with JJ-compatible I/Os is represented in FIG. 15a. The signals from the superconductive electronics are converted to CMOS-compatible signals. The conversion can be made with a merged su→sm interface/decoder design at the input. The write operations are the same as in the case of conventional CMOS memories. During the read operation, the read word lines are addressed in the conventional manner, but the currents in the bit-lines are sensed by JJ current detectors and multiplexed to the output using JJ circuits. An alternate organization with a large number of su→sm interface circuits is shown in FIG. 15b. This design is useful only in cases where advanced CMOS device technologies are not available and the JJ decoders have much smaller delay compared to the CMOS decoders.

(iv) VWL Designs with CMOS Compatible I/Os

Figure 16A:
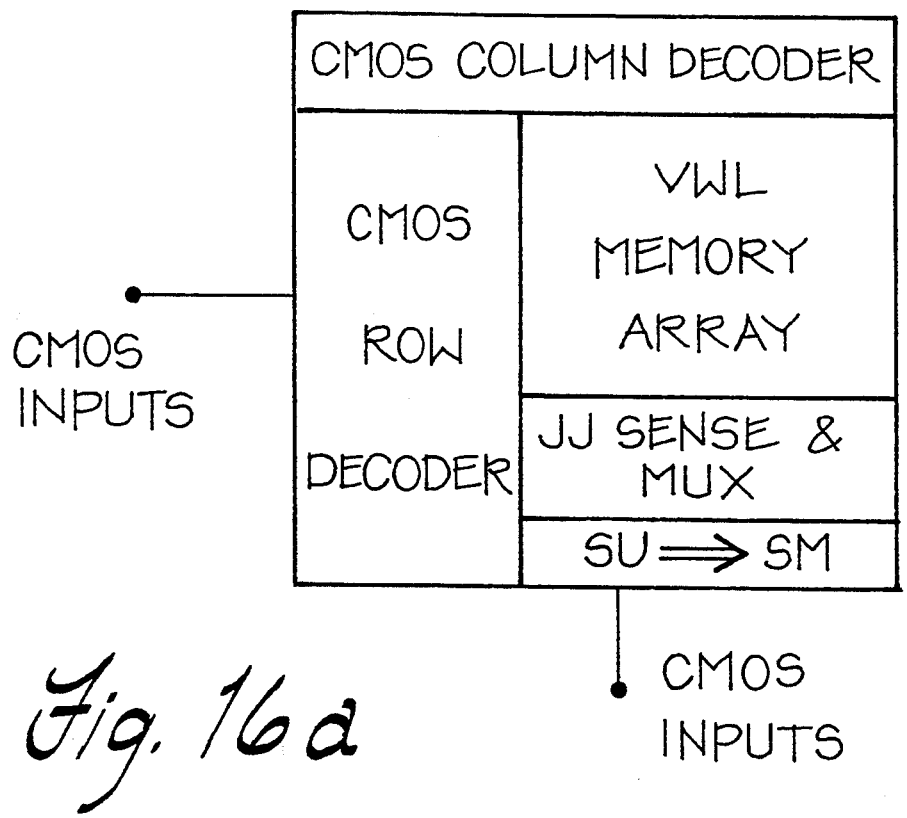
Figure 16B:
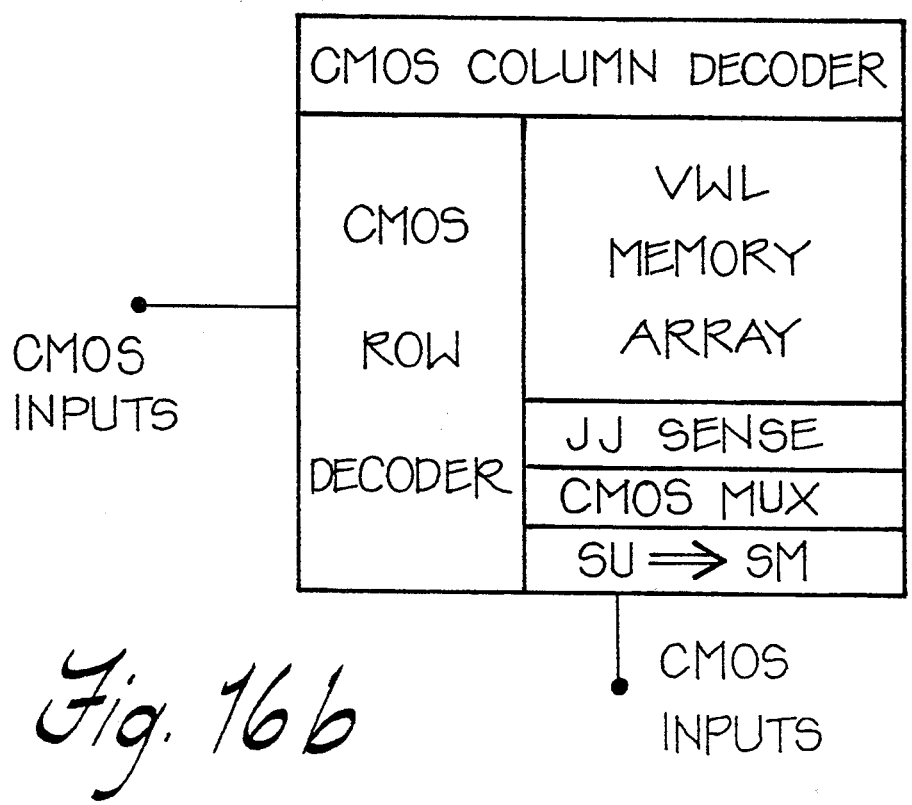

The organization represented in FIG. 16a uses a limited number of superconductive components. The only difference between this type of memory and the conventional semiconductor memory is the manner in which data in the bit-lines is sensed and detected. Superconducting bit-line current-detectors, multiplexing and su→sm interface circuits at the output can be self-timed using semiconductor current-sources. Therefore, the static power dissipation in this memory can be reduced to zero. Since superconducting tunnel junctions are not necessary, this type of hybrid memory should be viable at 77 kelvins with existing technology. If a minimum use of high temperature superconductors is desired, the data multiplexing at the outputs can be done using hybrid superconductor-CMOS circuits as represented in FIG. 16b.

(b) Organization of Large Memories (greater than or equal to 64 Kb)

Large semiconductor memories are organized hierarachically in order to reduce delay and power dissipation and to increase the sensitivity in detecting small voltages on the bit-lines. These methods are proposed and analyzed in the publication: C. Mead and L. Conway, Introduction to VLSI Systems, Reading, Mass.: Addison-Westley Publishing Company, 1980, Chapter 8, which is incorporated herein by reference, and have been used in most 4–16 Mb RAMs. Hierarchical organizations have also been used for memories embedded in pipeline architectures and other signal processing applications. See D. Schmitt-Landsiedel, B. Hoppe, G. Neuendorf, M. Wurm and J. Winnerl, "Pipelined architecture for fast CMOS buffer RAMs," IEEE J. Solid-State Circuits, vol. 25, pp. 741–47, June 1990.

Hierarchical structures are particularly well-suited for large hybrid memories because the use of superconducting circuits and interconnections permit easy communication between different sub-cells and only small superconducting decoders and multiplexors are needed at any particular level of hierarchy. As the size of the memory array grows, the RC time-constants associated with the word line in VWL memory circuits (or L/R time-constants in the case of CWL designs) become large, and larger word-line drivers are necessary. Hierarchy partitions long words and eliminates the need for large word-line drivers. This in turn reduces the power dissipation and the access-times of the memory.

A typical hierarchical 4 Mb hybrid memory is represented in FIG. 17. One Kb hybrid RAMs similar to the ones described above constitute the lowest level of hierarchy (level 0). At the next level of hierarchy (level 1), sixteen such 1 Kb RAMs are organized using two-bit JJ decoders and multiplexors to form a 16 Kb RAM. At level 2, sixteen 16 Kb RAMs of level 1 are organized using two-bit JJ decoders and multiplexors to form a 256 Kb RAM. The process is repeated at level 3, where sixteen 256 Kb RAMs are organized to form a 4 Mb RAM.

Other types of partial hierarchy are also possible. For example, in some VWL designs it would be better to have a fewer number of columns and a larger number of rows. This strategy takes advantage of the increased sensitivity of the superconducting current detectors to reduce the length of the word lines. In such cases the large row decoders can be hierarchically organized. Hierarchical strategies can also be used for multichip implementations of large hybrid memories comprised of smaller memories.

The present invention, therefore, is well adapted to carry out the objects and attain the ends and advantages mentioned as well as others inherent therein. While presently preferred embodiments of the inention have ben given for the purpose of disclosure, numerous changes in the details of design, construction and steps of the process will be readily apparent to those skilled in the art and which are encompassed within the spirit of the invention and the scope of the appended claims.

What is claimed is:

1. A memory cell for storing and accessing information in binary form of the type useful in computer or logic circuits applications wherein a matrix comprised of a plurality of memory cells of common design is formed in row and column format, with rows being addressed via word-lines and columns being addressed via bit-lines, said cell comprising:
   (a) a word-line input terminal;
   (b) a bit-line input terminal;
   (c) a first superconducting voltage controlled, three-terminal switching device, and a second superconducting voltage controlled, three-terminal switching device, each of said switching devices having a gate voltage terminal and first and second pass terminals, wherein the current flowing through each switching device via said pass terminals is controlled by the voltage applied to said gate terminal;
   (d) a semiconductor charge storing circuit for storing charge representing information in binary form, said semiconductor charge storing circuit having at least a first and a second output terminal; and
   (e) a superconducting current sensing means, said current sensing means having a biased current circuit with a bias input and a bias output, and a sensed current circuit with a sensed current input and a sensed current output;
   wherein said first pass terminal of said first switching device is connected to said word-line terminal;
   said gate terminal of said first switching device is connected to said first output terminal of said semiconductor charge storing circuit;
   said second pass terminal of said first switching device is connected to said sensed current input;
   said first pass terminal of said second switching device is connected to said word-line terminal;
   said gate terminal of said second switching device is connected to said second output terminal of said semiconductor charge storing circuit;
   said second pass terminal of said second switching device is connected to said sensed current output; and
   said bias input is connected to said bit-line input terminal.

2. The memory cell of claim 1, wherein said semiconductor charge storing circuit is a logic circuit being of a type that the output voltage on said first and second output terminals are logic complements.

3. The memory cell of claim 1, wherein said semiconductor charge storing circuit is a bi-stable logic circuit being of a type that the output voltage of said first and second output terminals are logic complements.

4. The memory cell of claim 1, wherein said first and second superconducting switch devices each comprise a superconducting field-effect transistor having a superconducting source, a superconducting drain, a conducting gate, and a semiconducting channel, and wherein the drain to source current is controlled by the applied gate to source voltage.

5. The memory cell of claim 1, wherein said superconducting current sensing means comprises a superconducting field-effect transistor having a superconducting source, a superconducting drain, a conducting gate, and a semiconducting channel, and wherein the drain is the sensed current input and the source is the sensed current output, and wherein the bias input is connected to said bit line and to said drain, and the bias output is connection to said source.

6. The memory cell of claim 1, wherein said superconducting current sensing means comprises a superconducting quantum interference device.

7. A memory cell for storing and accessing information in binary form of the type useful in computer or logic circuits applications wherein a matrix comprised of a plurality of memory cells of common design is formed in row and column format, with rows being addressed via word-lines and columns being addressed via bit-lines, said cell comprising:
   (a) a word-line input terminal;
   (b) a bit-line input terminal;
   (c) a first superconducting voltage controlled, three-terminal switching device, and a second superconducting voltage controlled, three-terminal switching device, each of said switching devices having a gate voltage terminal and first and second pass terminals wherein the current flowing through each switching device via said pass terminals is controlled by the voltage applied to said gate terminal, the current flow through said first switching device being biased by a gate terminal voltage the logic complement of the gate terminal voltage needed to bias current flow through said second switching device;
   (d) A gate terminal voltage creation means for actuating said switching devices having at least an output terminal;
   (e) a superconducting current sensing means, said current sensing means having a biased current circuit with a bias input and a bias output, and a sensed current circuit with a sensed current input and a sensed current output;
   wherein said first pass terminal of said first switching device is connected to said word-line terminal;
   said gate terminal of said first switching device is connected to said output terminal of said voltage creation means;
   said second pass terminal of said first switching device is connected to said sensed current input;
   said first pass terminal of said second switching device is connected to said word-line terminal;
   said gate terminal of said second switching device is connected to said output terminal of said voltage creation means;
   said second pass terminal of said second switching device is connected to said sensed current output; and
   said bias input is connected to said bit-line input terminal.

8. The memory cell of claim 7, wherein said first superconducting switch device comprises a superconducting field-effect transistor having a superconducting source, a superconducting drain, a conducting gate, and a n-doped semiconducting channel, and said second superconducting switch device comprises a superconducting field-effect transistor having a superconducting source, a superconducting drain, a conducting gate, and a p-doped semiconducting channel, wherein the drain to source current of said first switch device is biased by an applied gate to source voltage which is the logic complement of the applied gate to source voltage needed to bias the drain to source current of the second switching device.

9. The memory cell of claim 7, wherein said superconducting current sensing means comprises a superconducting field-effect transistor having a superconducting source, a superconducting drain, a conducting gate, and a semiconducting channel, and wherein the drain is the sensed current input and the source is the sensed current output, and wherein the bias input is connected to said bit line and to said drain, and the bias output is connected to said source.

10. The memory cell of claim 7, wherein said superconducting current sensing means comprises a superconducting quantum interference device.

11. The memory cell of claim 7, wherein said gate voltage creation means comprises a semiconducting field effect transistor having a semiconducting source, a semiconducting drain, a conducting gate, and a semiconducting channel, wherein the drain to source current is controlled by the applied gate to source voltage, and wherein said source is the output terminal of said gate voltage creation means.

12. A memory cell for storing and accessing information in binary form of the type useful in computer or logic circuits applications wherein a matrix comprised of a plurality of memory cells of common design is formed in row and column format, with rows being addressed via word-lines and columns being addressed via bit-lines, said cell comprising:
(a) a word-line input terminal;
(b) a bit-line input terminal;
(c) a superconducting voltage controlled, three-terminal switching device, said switching device having a gate voltage terminal and first and second pass terminals wherein the current flowing through said switching device via said pass terminals is controlled by the voltage applied to said gate terminal;
(d) an inductor means having an input terminal and an output terminal;
(e) a gate terminal voltage creation means for actuating said switching device having at least an output terminal;
(f) a superconducting current sensing means, said current sensing means having a biased current circuit with a bias input and a bias output, and a sensed current circuit with a sensed current input and a sensed current output;
wherein said first pass terminal of said switching device is connected to said word-line terminal;
said gate terminal of said switching device is connected to said voltage creation means;
said second pass terminal of said switching device is connected to said sensed current input;
said input terminal of said inductor means is connected to said word-line terminal;
said output terminal of said inductor means is connected to said sensed current output; and
said bias input is connected to said bit-line input terminal;

13. The memory cell of claim 12, wherein said inductor means is a superconducting inductor.

14. The memory cell of claim 12, wherein said inductor means is a metallic inductor.

15. The memory cell of claim 12, wherein said superconducting switch device comprises a superconducting field-effect transistor having a superconducting source, a superconducting drain, a conducting gate, and a superconducting channel, and wherein the drain to source current is controlled by the applied gate to source voltage.

16. The memory cell of claim 12, wherein said superconducting current sensing means comprises a superconducting field-effect transistor having a superconducting source, a superconducting drain, a conducting gate, and a semiconducting channel, and wherein the drain is the sensed current input and the source is the sensed current output, and wherein the bias input is connected to said bit line and to said drain, and the bias output is connection to said source.

17. The memory cell of claim 12, wherein said superconducting current sensing means comprises a superconducting quantum interference device.

18. A memory cell for storing and accessing information in binary form of the type useful in computer or logic circuits applications wherein a matrix comprised of a plurality of memory cells of common design is formed in row and column format, with rows being addressed via word-lines and columns being addressed via bit-lines, said cell comprising:
(a) a word-line input terminal;
(b) a bit-line input terminal;
(c) a first semiconducting voltage controlled, three-terminal switching device, said switching device having a gate voltage terminal and first and second pass terminals wherein the current flowing through said switching device via said pass terminals is controlled by the voltage applied to said gate terminal;
(d) a capacitance means having at least a first terminal and a second terminal; and
(e) a superconducting current sensing means, said current sensing means having a biased current circuit with a bias input and a bias output, and a sensed current circuit with a sensed current input and a sensed current output;
wherein said gate terminal of said switching device is connected to said word-line terminal;
said first pass terminal of said switching device is connected to said bit-line terminal;
said second pass terminal of said switching device is connected to said first terminal of said capacitance means;
said second terminal of said capacitance means is connected to electrical ground; and
said bias input is connected to said bit-line input terminal.

19. The memory cell of claim 18, wherein said capacitance means is the gate to source capacitance of a second semiconducting voltage controlled, three terminal switching device, said switching device having a gate voltage terminal and first and second pass terminals wherein the current flowing through said switching device via said pass terminals is controlled by the voltage applied to gate terminals and wherein said first pass terminal of said second switching device is connected to said second pass terminal of said first switching device, said gate terminal is the first terminal of said capacitance means of said capacitance means and said second terminal is said second pass terminal of said second semiconducting device.

20. The memory cell of claim 18, further comprising a gate terminal voltage creation means having at least an output terminal, wherein said output terminal is connected to said first terminal of said capacitance means.

21. The memory of claim 18, wherein said gate voltage creation means comprises a semiconducting field effect transistor having a semiconducting source, a semiconducting drain, a conducting gate, and a semiconducting channel, wherein the drain to source current is controlled by the applied gate to source voltage, and wherein said source is the output terminal of said gate voltage creation means.

22. The memory cell of claim 18, wherein said superconducting current sensing means comprises a superconducting field-effect transistor having a superconducting source, a superconducting drain, a conducting gate, and a semiconducting channel, and wherein the drain is the sensed current input and the source is the sensed current output, and wherein the bias input is connected to said bit line and to said drain, and the bias output is connection to said source.

23. The memory cell of claim 18, wherein said superconducting current sensing means comprises a superconducting quantum interference device.

24. The memory cell of claim 18, wherein said superconducting current sensing means comprises a rapid single flux quantum current sensing buffer/amplifier circuit.

25. The memory cell of claim 18, wherein said superconducting current sensing means comprises a superconductor link circuit.

26. The memory cell of claim 18, wherein said current sensing means further comprises a self-timing means comprising a voltage controlled three-terminal switching device having a gate voltage terminal and first and second pass terminals, wherein the current flowing through said switching device via said pass terminals is controlled by the voltage applied to said gate terminal, and wherein said gate terminal is connected to a self-timed signal, said first pass terminal is connected to said bias input and said second pass terminal is connected to said sensed current input.

27. The memory cell of claim 18, further comprising:
a data-in terminal;
a second voltage controlled three-terminal switching device comprising a gate voltage terminal and first and second pass terminals, wherein the current flowing through said switching device via said pass terminals is controlled by the voltage applied to said gate terminal;
a voltage source; and
a superconductor switching device having at least a first and second terminal;
wherein said data-in terminal is connected to said gate terminal of said second switching device;
said first pass terminal is connected to said voltage source;
said second pass terminal of said second switching device is connected to said first terminal of said superconductor switching device;
said second terminal of said superconductor switching device is connected to said first pass terminal of said first switching device.

28. The memory cell of claim 27, wherein said superconductor switching device is a stack of Josephson junction devices.

29. The memory cell of claim 27, wherein said superconductor switching device is a superconducting link.

30. The memory cell of claim 27, wherein said superconductor switching device is voltage controlled superconducting field-effect transistor having a conducting gate, a superconducting source and a superconducting drain, wherein the drain to source current is controlled by the applied gate to source voltage and wherein said gate is connected to said data-in terminal, said drain is connected to said second pass terminal of said second switching device, and said source is connected to said first terminal of said first switching device.

31. A method of accessing from a memory cell having at least a first terminal and a second terminal information in binary forms of the type useful in computer or logic circuit applications, wherein a matrix comprised of a plurality of memory cells of common design is formed in a row and column format, with rows being addressed via word lines, wherein each word line is connected to said first terminal of each memory cell in said row, and columns being addressed via bit-lines, wherein a superconducting current sensing means having a biased current circuit with a bias input and a bias output, and a sensed current circuit with a sensed current input and a sensed current output, is connected through said bias input to at least one bit-line and is connected to said second terminal of each memory cell in said column associated with at lest one bit-line, comprising the steps of:
(a) applying a current signal on said bit-line;
(b) applying a voltage signal on said word-line, said application of said current signal to said bit-line and said voltage signal thereby addressing a memmory cell, wherein said addressed memory cell to pass current through said second terminal when a binary one is stored in said memory addressed cell, and wherein when a binary zero is stored in said memory cell, current is not passed through said second terminal; and
(c) sensing whether there is a change in current passing through said sensed current input to said sensed current output of said superconductor sensing means, wherein a change in the current indicates that a combination of current from said second terminal of said addressed memory cell and said bit-line is passing through and a binary one stored, and wherein no change in the current indicates that only current from the bit-line is passing through and a binary zero is stored.

32. A method of accessing from a memory cell having at least a first terminal and a second terminal information in binary forms of the type useful in computer or logic circuit applications, wherein a matrix comprised of a plurality of memory cells of common design is formed in a row and column format, with rows being addressed via word lines, wherein each word line is connected to said first terminal of each memory cell in said row, and columns being addressed via bit-lines, wherein a superconducting current sensing means having a biased current circuit with a bias input and a bias output, and a sensed current circuit with a sensed current input and a sensed current output, is connected through said bias input to at least one bit-line and is connected to said second terminal of each memory cell in said column associated with at lest one bit-line, comprising the steps of:
(a) applying a current signal on said bit-line;

(b) applying a current signal on said word-line, said application of said current signal to said bit-line and said current signal to said word-line, thereby addressing a memory cell, wherein said current signal is passed to said second terminal of said addressed memory cell when a binary one is stored in said addressed memory cell and said current signal not being passed to said second terminal when a binary zero is stored; and (c) sensing whether there is a change in current passing through said sensed current input to said sensed current output of said superconductor sensing means, wherein a change in the current indicates that a combination of current from said second terminal of said addressed memory cell and said bit-line is passing through and a binary one stored, and wherein no change in the current indicates that only current from the bit-line is passing through and a binary zero is stored.

* * * * *